(12) United States Patent
Tang

(10) Patent No.: US 11,456,340 B2
(45) Date of Patent: Sep. 27, 2022

(54) ELECTROLUMINESCENT DISPLAY PANEL AND BRIGHTNESS COMPENSATION METHOD THEREFOR

(71) Applicants: Chengdu BOE Optoelectronics Technology Co., Ltd., Chengdu (CN); BOE Technology Group Co., Ltd., Beijing (CN)

(72) Inventor: Guoqiang Tang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 218 days.

(21) Appl. No.: 16/759,761

(22) PCT Filed: Jun. 10, 2019

(86) PCT No.: PCT/CN2019/090585
§ 371 (c)(1),
(2) Date: Apr. 28, 2020

(87) PCT Pub. No.: WO2020/062925
PCT Pub. Date: Apr. 2, 2020

(65) Prior Publication Data
US 2020/0328260 A1    Oct. 15, 2020

(30) Foreign Application Priority Data

Sep. 29, 2018 (CN) .......................... 201811148352.6

(51) Int. Cl.
*H01L 27/32* (2006.01)
*G09G 3/3291* (2016.01)

(52) U.S. Cl.
CPC ....... *H01L 27/3227* (2013.01); *G09G 3/3291* (2013.01); *H01L 27/322* (2013.01); *H01L 27/326* (2013.01); *G09G 2320/0233* (2013.01)

(58) Field of Classification Search
CPC ..... G09G 2320/0295; G09G 2320/144; G09G 2320/148; G09G 3/3291; H01L 27/326;
(Continued)

(56) References Cited

U.S. PATENT DOCUMENTS

2001/0035848 A1   11/2001   Johnson et al.
2005/0168415 A1   8/2005    Noda et al.
(Continued)

FOREIGN PATENT DOCUMENTS

CN    1364285 A    8/2002
CN    1652186 A    8/2005
(Continued)

OTHER PUBLICATIONS

Office Action for corresponding Chinese Application 201811148352.6 dated May 7, 2020.

*Primary Examiner* — Vongsavanh Sengdara
(74) *Attorney, Agent, or Firm* — ArentFox Schiff LLP; Michael Fainberg

(57) ABSTRACT

Disclosed are an electroluminescent display panel and a brightness compensation method therefor. The electroluminescent display panel is provided with photoelectric detectors corresponding to at least a portion of light-emitting structures. The photoelectric detector is used to convert, under control of a sample control line, light emitted when the corresponding light-emitting structure is turned on into an electric signal, and to output the same to a detection output line. The display panel employs a photoelectric detector to detect a change in display brightness of a corresponding light-emitting structure, such that voltage (Continued)

compensation can be performed on the light-emitting structure according to the detected brightness change, thereby ensuring good display performance of the entire display panel.

13 Claims, 9 Drawing Sheets

(58) Field of Classification Search
CPC . H01L 27/322; H01L 27/3211; H01L 27/3227
See application file for complete search history.

(56) References Cited

U.S. PATENT DOCUMENTS

| | | |
|---|---|---|
| 2006/0164345 A1 | 7/2006 | Sarma et al. |
| 2007/0241998 A1* | 10/2007 | Fish ............... H01L 27/3262 |
| | | 257/E23.114 |
| 2008/0074362 A1 | 3/2008 | Ogura |
| 2013/0038589 A1 | 2/2013 | Tseng et al. |
| 2016/0078806 A1* | 3/2016 | Lim ............... G09G 3/3275 |
| | | 345/212 |
| 2016/0232846 A1 | 8/2016 | Xu |
| 2017/0200411 A1* | 7/2017 | Song ............... H01L 27/3227 |
| 2018/0005571 A1 | 1/2018 | Song |
| 2018/0063424 A1* | 3/2018 | Wang .............. H04N 5/23232 |
| 2019/0057657 A1* | 2/2019 | Liu ............... H01L 27/3276 |
| 2019/0237480 A1 | 8/2019 | Cheng et al. |

FOREIGN PATENT DOCUMENTS

| | | |
|---|---|---|
| CN | 1934605 A | 3/2007 |
| CN | 103280181 A | 9/2013 |
| CN | 103956142 A | 7/2014 |
| CN | 104900186 A | 9/2015 |
| CN | 106887212 A | 6/2017 |
| CN | 107464529 A | 12/2017 |
| CN | 107731880 A | 2/2018 |
| CN | 108010955 A | 5/2018 |
| EP | 2028640 A2 | 2/2009 |
| JP | 2016062101 A | 4/2016 |
| TW | 200826044 A | 6/2008 |

* cited by examiner

ELECTROLUMINESCENT DISPLAY PANEL AND BRIGHTNESS COMPENSATION METHOD THEREFOR

The present application is a US National Stage of International Application No. PCT/CN2019/090585, filed on Jun. 10, 2019, which claims the priority of Chinese Patent Application No. 201811148352.6, filed with the Chinese Patent Office on Sep. 29, 2018 and entitled "Brightness Compensation Method and Device", which is hereby incorporated by reference in its entirety.

FIELD

The present disclosure relates to the technical field of display, in particular to an electroluminescent display panel and a brightness compensation method thereof.

BACKGROUND

Organic light emitting diode (OLED) display panel has attracted widespread attention, owing to the advantages of low energy consumption, self-illumination, wide viewing angle and rapid response speed. Since the OLED is driven by current, a stable current is required to control light emission of the OLED. However, due to such reasons as manufacturing process and device aging, the resistance of the OLED will be increased, thereby reducing the current flowing through the OLED, lowering display brightness, and further influencing the display effect of a whole image.

SUMMARY

The embodiments of the present disclosure provide an electroluminescent display panel and a brightness compensation method thereof, with the specific solutions as follows:

an embodiment of the present disclosure provides an electroluminescent display panel, including:

a plurality of pixel units, wherein each of the plurality of pixel units comprises a plurality of light-emitting structures of different colors;

photoelectric detectors arranged corresponding to at least part of the light-emitting structures; and sampling control lines and detection output lines connected with the photoelectric detectors;

where the photoelectric detectors each is configured to convert light emitted by corresponding illuminated light-emitting structure into electric signal under control of a sampling control line, and to output the electric signal to a detection output line.

Optionally, in the electroluminescent display panel provided in the embodiment of the present disclosure, the photoelectric detector includes a vertical phototransistor; where a gate of the vertical phototransistor is electrically connected with the sampling control line, a source of the vertical phototransistor is electrically connected with a high-voltage power line in the electroluminescent display panel, and a drain of the vertical phototransistor is electrically connected with the detection output line.

Optionally, in the electroluminescent display panel provided in the embodiment of the present disclosure, the photoelectric detector further includes: a filter arranged above the vertical phototransistor, where color of the filter is same as color of a light-emitting structure corresponding to the photoelectric detector.

Optionally, in the electroluminescent display panel provided in the embodiment of the present disclosure, the electroluminescent display panel further includes: a reflective layer arranged corresponding to the photoelectric detector;

where the reflective layer is configured to reflect the light emitted by the corresponding illuminated light-emitting structure onto the photoelectric detector.

Optionally, in the electroluminescent display panel provided in the embodiment of the present disclosure, orthographic projection of the reflective layer on the electroluminescent display panel is located between orthographic projection of the corresponding photoelectric detector on the electroluminescent display panel and orthographic projection of the corresponding light-emitting structure on the electroluminescent display panel.

Optionally, in the electroluminescent display panel provided in the embodiment of the present disclosure, the pixel units each includes: a first color light-emitting structure, a second color light-emitting structure and a third color light-emitting structure;

the photoelectric detectors which are respectively corresponding to the first color light-emitting structure, the second color light-emitting structure and the third color light-emitting structure in the same pixel unit are taken as one photoelectric detection group; and the photoelectric detection group, the first color light-emitting structure, the second color light-emitting structure and the third color light-emitting structure are arranged in a two-row and two-column array in the display panel.

Optionally, in the electroluminescent display panel provided in the embodiment of the present disclosure, the photoelectric detector and the corresponding light-emitting structure are arranged adjacently along a column direction.

Optionally, in the electroluminescent display panel provided in the embodiment of the present disclosure, the photoelectric detectors, arranged in the same column and corresponding to the light-emitting structures of the same color, are connected with the same detection output line; and the photoelectric detectors arranged in the same row are connected with the same sampling control line.

Optionally, in the electroluminescent display panel provided in the embodiment of the present disclosure, the electroluminescent display panel further includes: a voltage acquisition circuit arranged corresponding to each detection output line;

the voltage acquisition circuit includes: a reference resistor, a first switch transistor, a second switch transistor, an operational amplifier, an integrating capacitor, and a storage capacitor, wherein, a first end of the reference resistor is electrically connected with the corresponding detection output line, a second end of the reference resistor is respectively electrically connected with a first electrode of the first switch transistor, a first electrode of the second switch transistor, a first electrode of the integrating capacitor and an inverting input end of the operational amplifier;

a gate of the first switch transistor is configured to receive acquisition control signals, and a second electrode of the first switch transistor is respectively electrically connected with a second end of the integrating capacitor and an output end of the operational amplifier, and is configured to output first detection voltage and second detection voltage;

a gate of the second switch transistor is configured to receive the acquisition control signals, and a second electrode of the second switch transistor is respectively electrically connected with a first end of the storage capacitor and an in-phase input end of the operational amplifier; and a second end of the storage capacitor is connected with a grounded end.

Correspondingly, the embodiment of the present disclosure further provides a brightness compensation method applicable to any of the above electroluminescent display panels, where the method includes:

controlling the electroluminescent display panel to be illuminated from being extinguished, and acquiring a present current variation of each photoelectric detector; where each of the light-emitting structures is configured to be illuminated when a current data voltage is applied;

determining an initial data voltage corresponding to each of the present current variations, according to a predetermined correspondence table of an initial current variation and an initial data voltage and according to the acquired present current variation corresponding to each of the photoelectric detectors; and determining a voltage difference between each of initial data voltages and a corresponding current data voltage, such that when the electroluminescent display panel displays images, data voltage compensation is performed according to the determined voltage difference.

Optionally, in the brightness compensation method provided in the embodiment of the present disclosure, each of the light-emitting structures corresponding to the photoelectric detector respectively corresponds to one predetermined correspondence table of the initial current variation and the initial data voltage;

the step of determining the initial data voltage corresponding to each of the present current variations specifically includes:

determining the initial data voltage corresponding to each of the present current variations, according to the predetermined correspondence table which corresponds to each of the light-emitting structures corresponding to the photoelectric detectors and according to the acquired present current variation of each of the photoelectric detectors.

Optionally, in the brightness compensation method provided in the embodiment of the present disclosure, the light-emitting structures of the same color correspond to a predetermined correspondence table of the initial current variation and the initial data voltage;

the step of determining the initial data voltage corresponding to each of the present current variations specifically includes:

for each light-emitting structure of the same color, determining the initial data voltage corresponding to each of the present current variations, according to the predetermined correspondence table which corresponds to the light-emitting structures of the same color and according to the acquired present current variation corresponding to each of the photoelectric detectors.

Optionally, in the brightness compensation method provided in the embodiment of the present disclosure, the predetermined correspondence table of the initial current variation and the initial data voltage includes: a plurality of predetermined sub-correspondence tables of an initial current variation and an initial data voltage corresponding to different ambient brightness ranges;

before controlling the electroluminescent display panel to be illuminated from being extinguished, and acquiring the present current variation of each photoelectric detector, the method further includes:

detecting a current ambient brightness value of an environment in which the electroluminescent display panel is located;

for each of the light-emitting structures corresponding to the photoelectric detectors, determining a sub-correspondence table corresponding to the current ambient brightness value according to the current ambient brightness value and an ambient brightness range;

the step of determining the initial data voltage corresponding to each of the present current variations specifically comprises:

determining the initial data voltage corresponding to each of the present current variations, according to the determined sub-correspondence table corresponding to the current ambient brightness value and the acquired present current variation corresponding to each of the photoelectric detectors.

Optionally, in the brightness compensation method provided in the embodiment of the present disclosure, the step of controlling the electroluminescent display panel to be illuminated from being extinguished, and acquiring the present current variation of each photoelectric detector specifically includes:

for the light-emitting structures of each color corresponding to the photoelectric detectors, controlling each light-emitting structure of the color to be extinguished, and acquiring, by the detection output line corresponding to the light-emitting structures of the color, a first detection voltage corresponding to a photoelectric detector connected to the detection output line;

controlling each light-emitting structure of the color to be illuminated, and acquiring, by the detection output line corresponding to the light-emitting structures of the color, a second detection voltage corresponding to the photoelectric detector connected to the detection output line; and determining the present current variation corresponding to each of the photoelectric detectors, according to the first detection voltage and second detection voltage corresponding to each of the photoelectric detectors corresponding to light-emitting structures of the color.

Correspondingly, an embodiment of the present disclosure further provides a computer readable storage medium stored with computer programs thereon, where when the programs are executed by a processor, the above method provided in the embodiment of the present disclosure is implemented.

Correspondingly, an embodiment of the present disclosure further provides a computer device, including a memory, a processor and computer programs which are stored on the memory and capable of running on the processor, where when the programs are executed by a processor, the above method provided in the embodiment of the present disclosure is implemented.

DETAILED DESCRIPTION OF THE EMBODIMENTS

Figure 1:
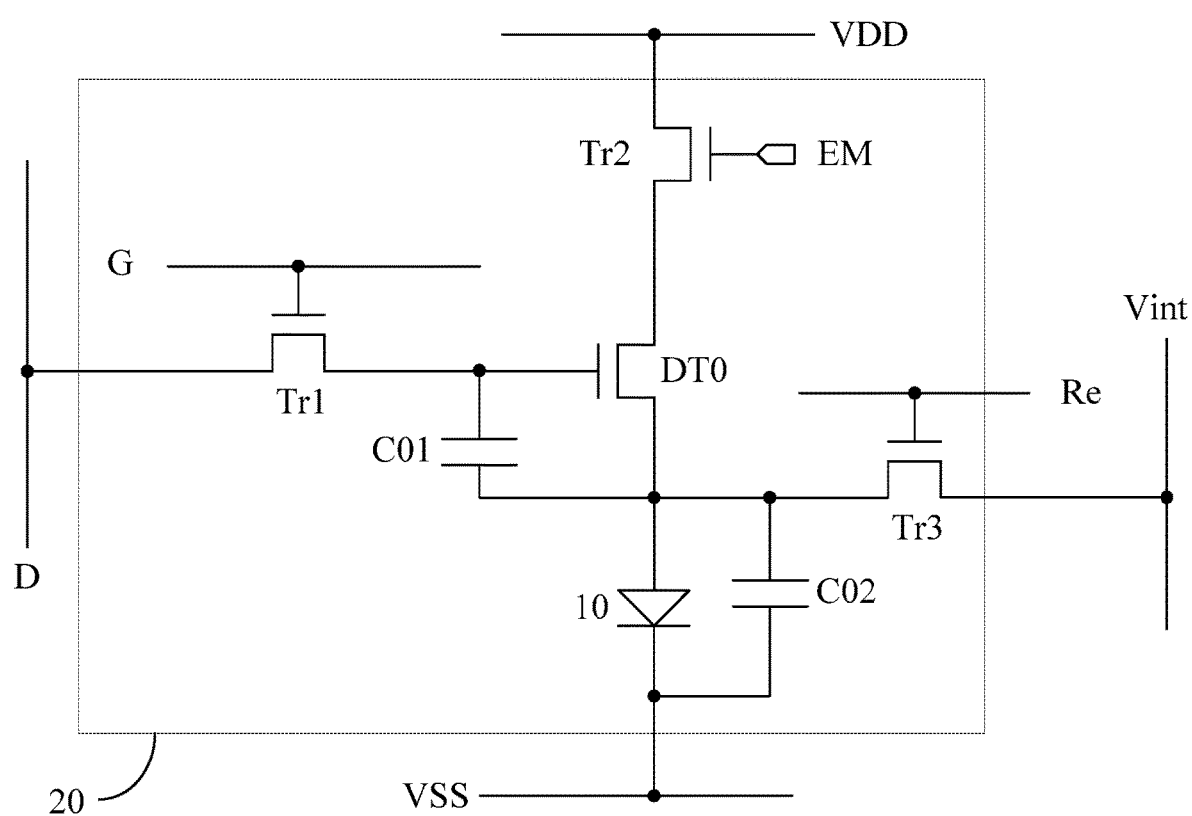
FIG. 1 is a structural schematic diagram of a light-emitting structure provided in an embodiment of the present disclosure.

In order to make the objectives, technical solutions, and advantages of the present disclosure clearer, a brief description will be given below on specific embodiments of a brightness compensation method, an electroluminescent display panel and a device provided in the embodiments of the present disclosure in combination with accompanying drawings. It should be understood that, the preferred embodiments described below are merely for illustrating and explaining the present disclosure, rather than for limiting the present disclosure. Moreover, without conflict, the embodiments and characteristics in embodiments of the present application can be combined with each other.

It should be noted that, in the drawings, the thickness and shape of each layer of film do not reflect the true proportion, merely aiming at schematically illustrating the content of the present disclosure. Moreover, the same or similar reference numerals throughout the text represent the same or similar elements or the element with the same or similar functions.

The electroluminescent display panel can include multiple pixel units, multiple gate lines, multiple reset signal lines, multiple light-emitting control signal lines, multiple data lines, a high-voltage power line, a low-voltage power line and an initialization signal line. Each pixel unit can include multiple light-emitting structures of different colors. A row of pixel units correspond to one gate line, one light-emitting control signal line and one reset signal line, and the light-emitting structures of the same color in the same column correspond to one data line.

Specifically, as shown in FIG. 1, the light-emitting structure can include an OLED 10 and a pixel circuit 20 which drives the OLED 10 to emit light. The pixel circuit 20 can include a drive transistor DT0, a first transistor to a third Tr1-Tr3, a first capacitor C01 and a second capacitor C02. Here a gate of the first transistor Tr1 is electrically connected with a corresponding gate line G, a first electrode of the first transistor Tr1 is electrically connected with a corresponding data line D, and a second electrode of the first transistor Tr1 is electrically connected with a gate of the drive transistor DT0. A gate of the second transistor Tr2 is electrically connected with the corresponding light-emitting control signal line EM, a first electrode of the second transistor Tr2 is electrically connected with the high-voltage power line VDD, and a second electrode of the second transistor Tr2 is electrically connected with a drain of the drive transistor DT0. A gate of the third transistor Tr3 is electrically connected with the corresponding reset signal line Re, a first electrode of the third transistor Tr3 is electrically connected with the initialization signal line Vint, and a second electrode of the third transistor Tr3 is electrically connected with a source of the drive transistor DT0. An anode of the OLED 10 is electrically connected with the source of the drive transistor DT0, and a cathode of the OLED 10 is electrically connected with the low-voltage power line VSS. The first capacitor C01 is connected between the gate and the source of the drive transistor DT0. The second capacitor C02 is connected between the source of the drive transistor DT0 and the cathode of the OLED 10.

It should be noted that, the working principle of the above pixel circuit 10 is basically the same as the principle in the prior art, and is not repeated redundantly herein.

Due to such reasons as manufacturing process and device aging, the resistance of the OLED 10 will be increased, thereby reducing the current flowing through the OLED 10, lowering display brightness, and further influencing the display effect of a whole image.

Figure 2:
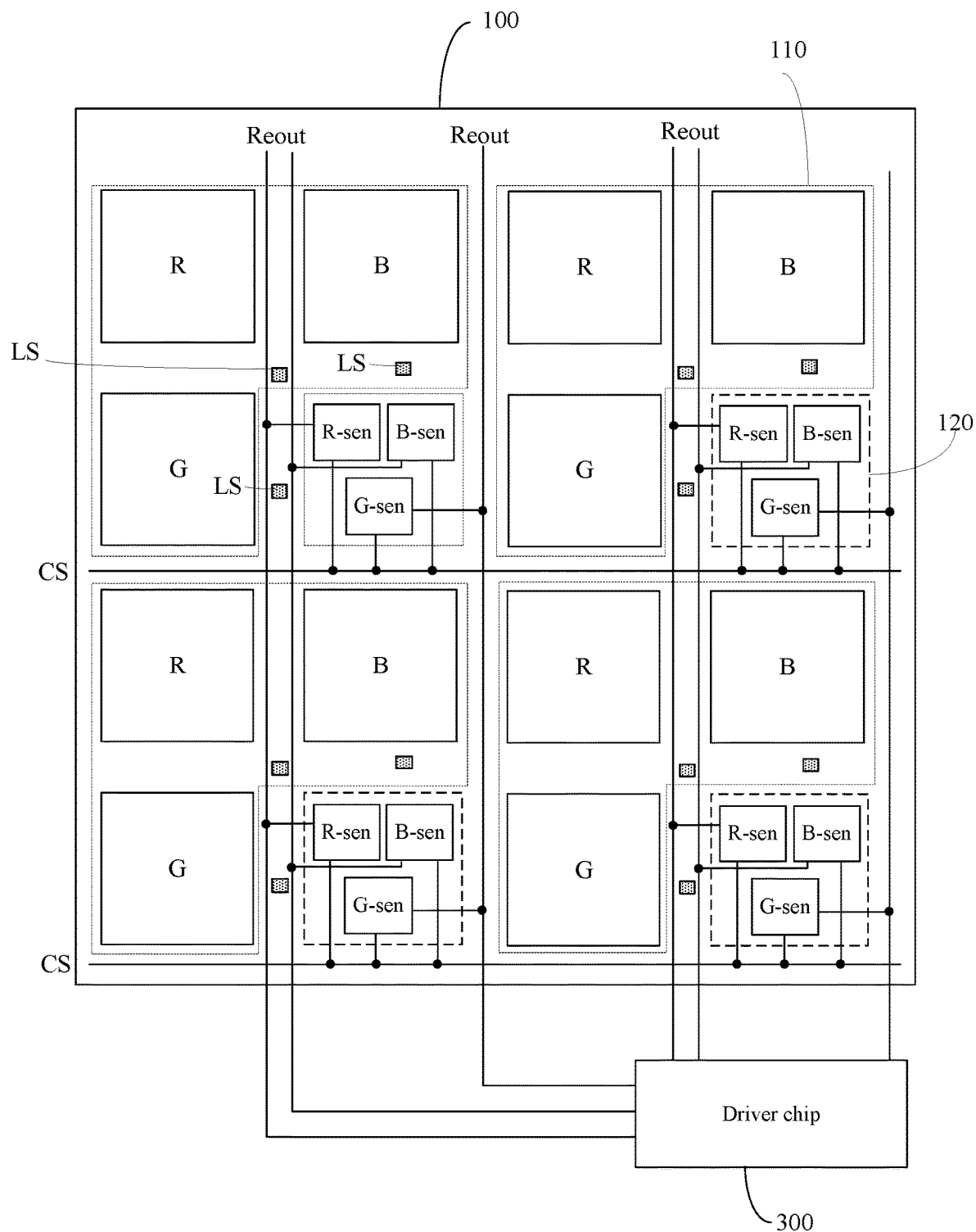
FIG. 2 is a schematic diagram of a top view of an electroluminescent display panel provided in an embodiment of the present disclosure.
Figure 3:
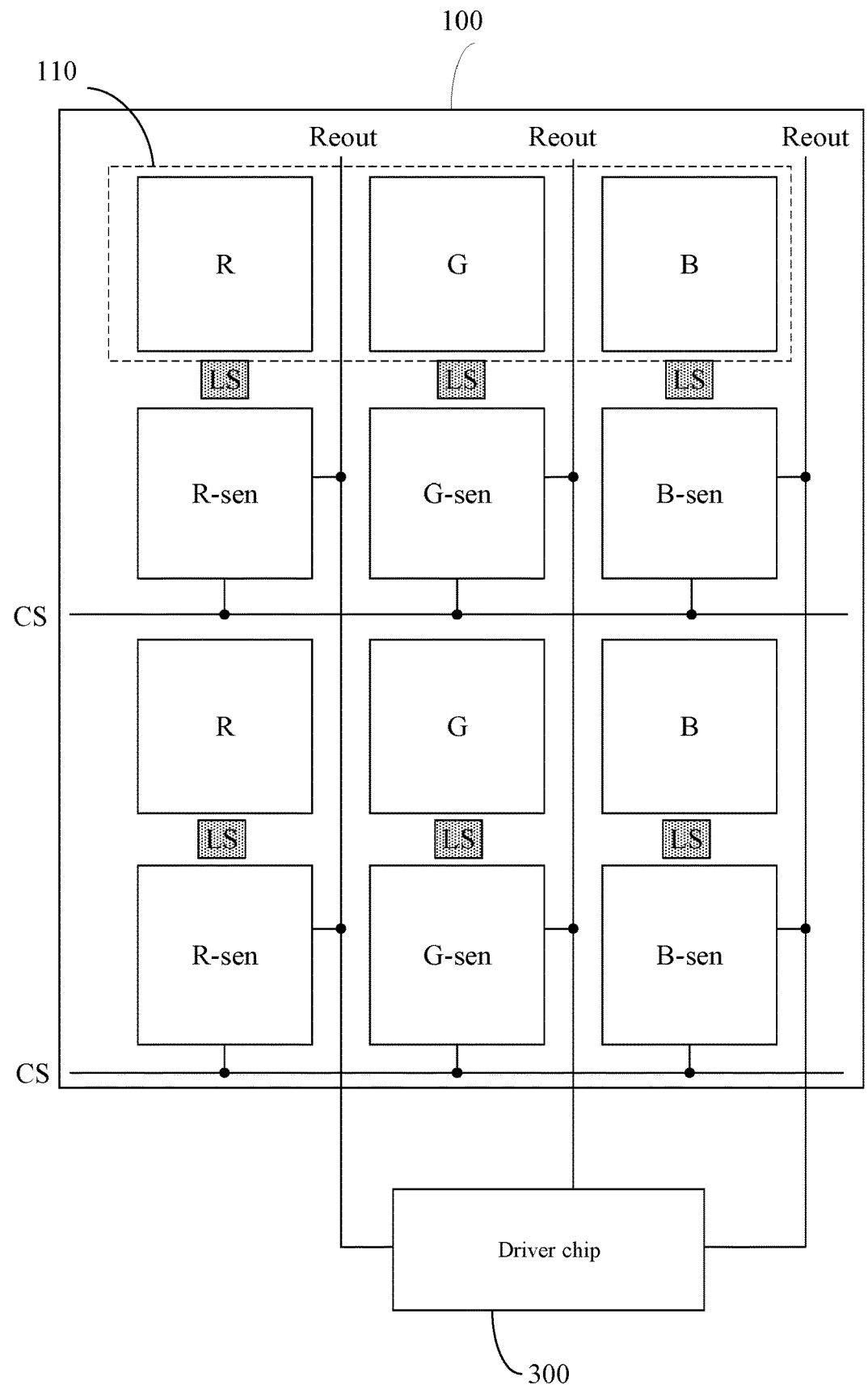
FIG. 3 is a schematic diagram of a top view of an electroluminescent display panel provided in another embodiment of the present disclosure.

In view of this, an embodiment of the present disclosure provides an electroluminescent display panel 100, as shown in FIG. 2 and FIG. 3, the electroluminescent display panel 100 includes:

a plurality of pixel units 110, where each of the pixel units 110 can include a plurality of light-emitting structures (R, G and B) of different colors;

photoelectric detectors (R-sen, G-sen or B-sen) arranged corresponding to at least part of the light-emitting structures (R, G or B); and sampling control lines CS and detection output lines Reout connected with the photoelectric detectors (R-sen, G-sen and B-sen);

where the photoelectric detectors (R-sen, G-sen and B-sen) are configured to convert the light emitted by the corresponding illuminated light-emitting structures (R, G and B) into electric signals under the control of the sampling control lines CS and output the electric signals to the detection output lines Reout.

As to the electroluminescent display panel provided in an embodiment of the present disclosure, through setting photoelectric detectors corresponding to at least part of the light-emitting structures, the photoelectric detector converts the light emitted by the corresponding illuminated light-emitting structure into electric signals under the control of the sampling control line and outputs the electric signals to the detection output lines, thus display brightness variation of the corresponding light-emitting structure is detected by the photoelectric detectors, to allow voltage compensation on the light-emitting structure according to the detected brightness variation, thereby ensuring the overall display effect of the display panel.

During specific implementation, the corresponding photoelectric detector can be set respectively for each light-emitting structure, in this way, voltage compensation can be performed for the brightness of each light-emitting structure. Of course, the display panel can also be divided into different areas, and in each area, one of light-emitting structures is selected to set with a photoelectric detector, in this way, for the whole area, voltage compensation can be performed according to the brightness of the selected light-emitting structure.

Specifically, the light-emitting structure can include a first color light-emitting structure, a second color light-emitting structure, and a third color light-emitting structure. Further, the first color light-emitting structure can include a red light-emitting structure R, the second color light-emitting structure can include a green light-emitting structure G, and the third color light-emitting structure can include a blue light-emitting structure B. Of course, the light-emitting structure can also include light-emitting structures of other colors, which needs to be designed and determined according to practical application environments, and will not be limited herein.

Further, one detection output line can be connected to the photoelectric detectors corresponding to the light-emitting structures of the same color in a column, or one detection output line can also be connected to the photoelectric detectors corresponding to one column of light-emitting structures, which needs to be designed and determined according to actual application environments, and will not be defined herein. During specific implementation, one sampling control line can be connected with one row of photoelectric detectors.

Figure 4:
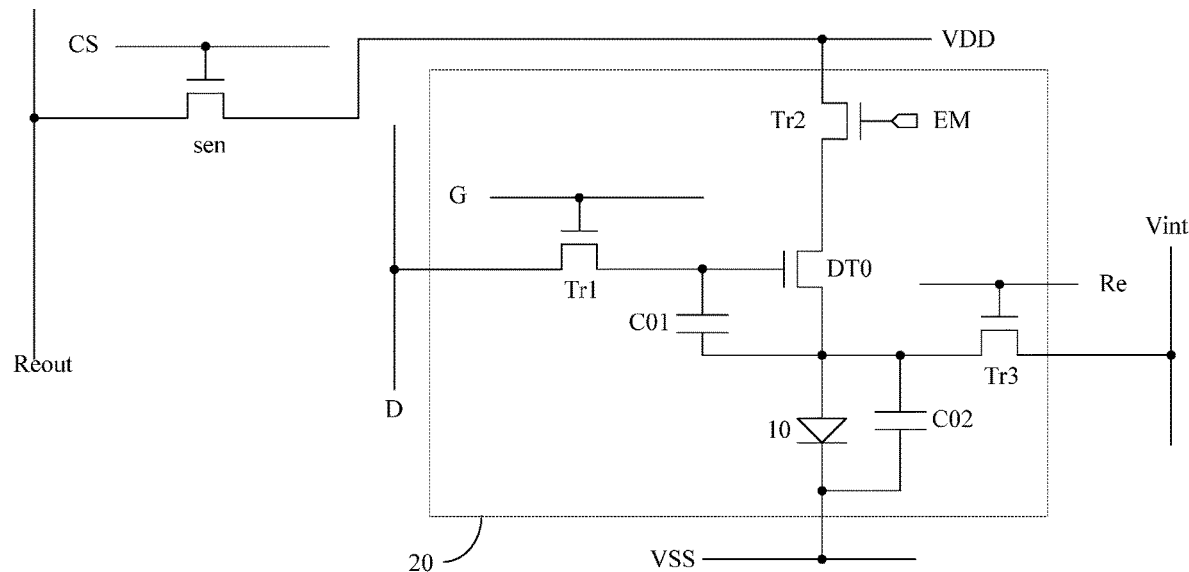
FIG. 4 is a structural schematic diagram of a light-emitting structure and a photoelectric detector provided in an embodiment of the present disclosure.

Specifically, as shown in FIG. 4, a control end of the photoelectric detector sen is electrically connected with the corresponding sampling control line CS, an input end is connected with the high-voltage power line VDD, and an output end is electrically connected with the corresponding detection output line Reout, such that the photoelectric detector sen is turned on or off under the control of the sampling control signals transmitted by the sampling control line CS.

The light-emitting structures including a red light-emitting structure R, a green light-emitting structure G and a blue light-emitting structure B is taken as an example below for illustration. As shown in FIG. 2 and FIG. 3, the red light-emitting structure R corresponds to a photoelectric detector R-sen, and the photoelectric detector R-sen is configured to convert the light emitted by the illuminated red light-emitting structure R into electric signals; the green light-emitting structure G corresponds to a photoelectric detector G-sen, and the photoelectric detector G-sen is configured to convert the light emitted by the illuminated green light-emitting structure G into electric signals; and the blue light-emitting structure B corresponds to a photoelectric detector B-sen, and the photoelectric detector B-sen is configured to convert the illuminated light emitted by the blue light-emitting structure B into electric signals.

During specific implementation, as shown in FIG. 2, when the pixel unit 110 includes a first color light-emitting structure, a second color light-emitting structure and a third color light-emitting structure, that is, when the pixel unit includes a red light-emitting structure R, a green light-emitting structure G and a blue light-emitting structure B, in the embodiment of the present disclosure, the photoelectric detectors which are respectively corresponding to the first color light-emitting structure, the second color light-emitting structure and the third color light-emitting structure in the same pixel unit 110 are taken as one photoelectric detection group 120; the photoelectric detection group 120, the first color light-emitting structure, the second color light-emitting structure and the third color light-emitting structure are arranged in a two-row and two-column array in the display panel. For example, as shown in FIG. 2, the photoelectric detector R-sen corresponding to the red light-emitting structure R, the photoelectric detector G-sen corresponding to the green light-emitting structure G, and the photoelectric detector B-sen corresponding to the blue light-emitting structure B are taken as one photoelectric detection group 120. The red light-emitting structure R, the green light-emitting structure G, the blue light-emitting structure B and the photoelectric detection group 120 are arranged in a two-row and two-column array (that is, arranged like a Chinese character "田") in the display panel, in this way, the photoelectric detectors corresponding to all the light-emitting structures in a pixel unit can be arranged in an area which can be arranged with a light-emitting structure, thereby increasing the aperture ratio of the photoelectric detector, and improving the photoelectric conversion responsivity and detection capability.

Specifically, as shown in FIG. 2, each photoelectric detector in the photoelectric detection groups 120 arranged in the same row can be connected with the same sampling control line CS.

During specific implementation, the photoelectric detectors and corresponding light-emitting structures can be arranged adjacently along a column direction. With the pixel unit 110 including the first color light-emitting structure, the second color light-emitting structure and the third color light-emitting structure as an example, that is, with the pixel unit 110 including the red light-emitting structure R, the green light-emitting structure G and the blue light-emitting structure B as an example, as shown in FIG. 3, the red light-emitting structure R and its corresponding photoelectric detector R-sen are arranged adjacently along a column direction, the green light-emitting structure G and its corresponding photoelectric detector G-sen are arranged adjacently along a column direction, the blue light-emitting structure B and its corresponding photoelectric detector B-sen are arranged adjacently along a column direction. In this way, a photoelectric detector can be arranged in an area which can be arranged with a light-emitting structure, thereby increasing the aperture ratio of the photoelectric detector, and improving the photoelectric conversion responsivity and detection capability.

Specifically, as shown in FIG. 3, the photoelectric detectors arranged in the same row can be connected with the same sampling control line CS.

Further, the photoelectric detector includes a vertical phototransistor, where a gate of the vertical phototransistor is electrically connected with the sampling control line, a source of the vertical phototransistor is electrically connected with a high-voltage power line in the electroluminescent display panel, and a drain of the vertical phototransistor is electrically connected with the detection output line. Since the light absorption area of the active layer of the vertical phototransistor is relatively large, the photoelectric conversion efficiency of the phototransistor can be improved by utilizing a vertical phototransistor.

Figure 5:
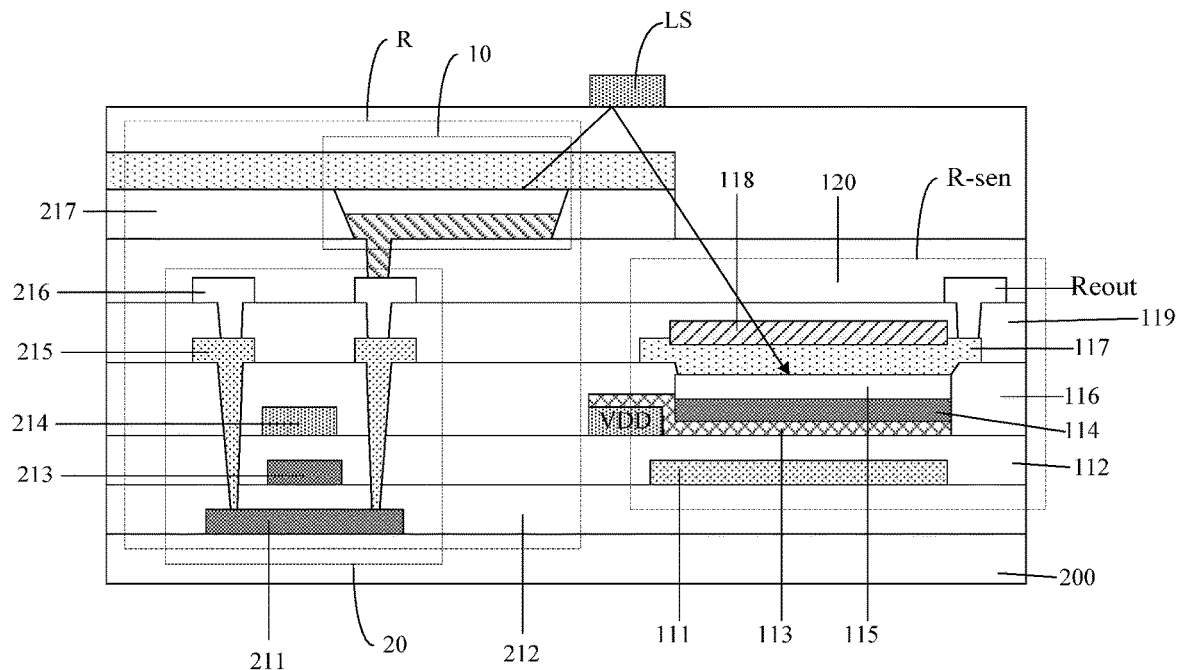
FIG. 5 is a schematic diagram of part of the sectional structure of an electroluminescent display panel provided in an embodiment of the present disclosure.

Specifically, the red light-emitting structure R and its corresponding photoelectric detector R-sen are taken as an example for illustration. During specific implementation, in the embodiment of the present disclosure, as shown in FIG. 5, the red light-emitting structure R can include an OLED 10 and a pixel circuit 20 which drives the OLED 10 to emit light. Here the circuit schematic diagram of the OLED 10 and the pixel circuit 20 is as shown in FIG. 4. The gate of the photoelectric detector R-sen is electrically connected with the sampling control line CS the source of the photoelectric detector R-sen is electrically connected with the high-voltage power line VDD, and the drain of the photoelectric detector R-sen is electrically connected with the detection output line Reout.

Further, during specific implementation, as shown in FIG. 5, the vertical photoelectric transistor as a photoelectric detector R-sen can include: a first gate 111, a first gate insulating layer 112, a high-voltage power line VDD, a porous source 113 serving as a source of the vertical phototransistor, a first active layer 114, a photosensitive layer 115, an interlayer dielectric layer 116 and a transparent drain 117 serving as a drain of the vertical phototransistor, all of which are arranged in sequence on the substrate 200 of the electroluminescent display panel. Here, the orthographic projection of the porous source 113 on the substrate 200 covers the orthographic projection of the high-voltage power line VDD on the substrate, such that the porous source 113 is electrically connected with the high-voltage power line VDD. The orthographic projection of the first active layer 114 on the substrate 200 covers the orthographic projection of the photosensitive layer 115 on the substrate 200. The transparent drain 117 is electrically connected with the photosensitive layer 115 through a first via hole which penetrates through the interlayer dielectric layer 116. Moreover, the orthographic projection of the first via hole on the substrate 200 is located within the orthographic projection of the photosensitive layer 115 on the substrate 200, and the orthographic projection of the first via hole in the substrate 200 can be as big as possible, such that the contact area of the transparent drain 117 and the photosensitive layer 115 is increased. The orthographic projection of the transparent drain 117 on the substrate 200 covers the orthographic projection of the photosensitive layer 115 on the substrate 200. During practical manufacturing process, the manufacturing sequence of the vertical phototransistor is as follows in sequence: first gate 111→first gate insulating layer 112→>high-voltage power line VDD→porous source 113→first active layer 114→>photosensitive layer 115→>interlayer dielectric layer 116→>transparent drain 117.

Optionally, during specific implementation, in the embodiment of the present disclosure, the material of the porous source 113 can include a carbon nano tube network. Since the carbon nano tube network has a porous structure, signal shielding of the source to the gate can be avoided.

Optionally, during specific implementation, in the embodiment of the present disclosure, the material of the transparent drain 117 can include a transparent conductive material, to allow light to enter the photosensitive layer 115 through the transparent drain 117. The photosensitive layer 115 can generate electrons under the effect of illumination, such that the current flowing out of the transparent drain 117 is increased under the effect of illumination. Since the light absorption area of the photosensitive layer 115 is relatively large, therefore, the aperture ratio is large, and the photoelectric conversion responsivity and detection capability are improved.

During specific implementation, only the drive transistor DT0 is taken as an example for illustration. As shown in FIG. 5, the drive transistor DT0 can include: a second gate insulating layer 212 disposed between the first gate 111 and the substrate 200, a second active layer 211 disposed between the second gate insulating layer 212 and the substrate 200, a second gate 213 which is set in the same layer and made of the same material as the first gate 111, a metal layer 214 which is set in the same layer and made of the same material as the high-voltage power line VDD, and a source/drain layer 215 which is set to be in the same layer as the transparent drain 117. Here the source of the source/drain layer 215 is electrically connected with the second active layer 211 through a second via hole which penetrates through the interlayer dielectric layer 116, the first gate insulating layer 112 and the second gate insulating layer 212, such that the source of the drive transistor is electrically connected with the second active layer 211. The drain of the source/drain layer 215 is electrically connected with the second active layer 211 through a third via hole which penetrates through an interlayer dielectric layer 116, a first gate insulating layer 112 and a second gate insulating layer 212, such that the drain of the drive transistor is electrically connected with the second active layer 211. During specific implementation, the materials of the transparent drain 117 and the source/drain layer 215 can be the same or different, which is not defined herein. Moreover, the metal layer 214 and the second gate 213 have an overlapping area to form a first capacitor C01 in the pixel circuit.

Further, in order to avoid influence of illumination of other colors, during specific implementation, in the embodiment of the present disclosure, the photoelectric detector further includes: a filter arranged above the vertical phototransistor, here the color of the filter is the same as the color of the light-emitting structure corresponding to the photoelectric detector. As shown in FIG. 5, the filter 118 is arranged on a side, facing away from the substrate 200, of the transparent drain 117. The orthographic projection of the filter 118 on the substrate 200 covers the orthographic projection of the photosensitive layer 115 on the substrate 200.

Specifically, the filter 118 corresponding to the photoelectric detector R-sen is a red filter which enables the red light emitted by the red light-emitting structure R to pass through. The filter corresponding to the photoelectric detector G-sen is a green filter which enables the green light emitted by the green light-emitting structure to pass through. The filter corresponding to the photoelectric detector B-sen is a blue filter which enables the blue light emitted by the blue light-emitting structure to pass through.

Further, during specific implementation, in the embodiment of the present disclosure, as shown in FIG. 5, the electroluminescent display panel can further include: a first planarization layer 119 disposed on a side, facing away from the substrate 200, of the filter 118, and a detection output line Reout and a bridging layer 216 which are disposed on a side, facing away from the substrate 200, of the first planarization layer 119. Here the detection output line Reout and the bridging line 216 can be disposed in the same layer and made of the same material, so as to simplify the process. The bridging layer 216 can include a first sub-bridging layer and a second sub-bridging layer, the first sub-bridging layer is electrically connected with the source of the source/drain layer 215 through a fourth via hole which penetrates through the first planarization layer 119, and the second sub-bridging layer is electrically connected with the drain in the source/drain layer 215 through a fifth via hole which penetrates through the first planarization layer 119. Moreover, the detection output line Reout is electrically connected with the transparent drain 117 through a sixth via hole which penetrates through the first planarization layer 119.

Further, during specific implementation, in the embodiment of the present disclosure, as shown in FIG. 5, the electroluminescent display panel can further include: a second planarization layer 120 disposed on a side, facing away from the substrate 200, of the detection output line Reout, the OLED 10 disposed on a side, facing away from the substrate 200, of the second planarization layer 120, and a pixel defining layer 217 disposed between the sub-units. Here the OLED 10 can include: an anode, a light-emitting layer and a cathode which are disposed in sequence on a side, facing away from the substrate 200, of the second planarization layer 120. The anode is electrically connected with the second sub-bridging layer through a seventh via hole which penetrates through the second planarization layer 120.

Further, in order to let the light emitted by the light-emitting structure irradiate onto the photoelectric detector, during specific implementation, in the embodiment of the present disclosure, as shown in FIG. 2, FIG. 3 and FIG. 5, the electroluminescent display panel can further include: reflective layers LS in one-to-one correspondence with each photoelectric detector. In order to let the reflective layer LS reflect the light emitted by the corresponding illuminated light-emitting structure onto the photoelectric detector, the photoelectric detector and the light-emitting structure can be disposed on the same side of the reflective layer. Specifically, the reflective layer LS can be disposed on a side, facing away from the substrate 200 of the electroluminescent display panel, of the light-emitting structure, that is, disposed on a side, facing away from the substrate 200 of the electroluminescent display panel, of the cathode. In this way, the reflective layer LS reflects the light emitted by the illuminated light-emitting structure onto the photoelectric detector, to improve the photoelectric conversion responsivity and detection capability. Of course, specific positions of the reflective layer can also be arranged in other manners, such that the reflective layer LS reflects the light emitted by the illuminated corresponding light-emitting structure onto the photoelectric detector, and the specific positions are not limited herein.

Further, since the incidence angle and the reflection angle of light are the same, during specific implementation, in the embodiment of the present disclosure, in combination with FIG. 2, FIG. 3 and FIG. 5, the orthographic projection of the reflective layer LS on the electroluminescent display panel 100 can be located between the orthographic projection of the corresponding photoelectric detector on the electroluminescent display panel 100 and the orthographic projection of the corresponding light-emitting structure on the electroluminescent display panel 100. Further, the center of the orthographic projection of the reflective layer LS on the electroluminescent display panel 100, the center of the orthographic projection of the photoelectric detector corresponding to the reflective layer LS on the electroluminescent display panel 100, and the center of the orthographic projection of the light-emitting structure corresponding to the reflective layer LS on the electroluminescent display panel 100 are located on the same straight line. During practical application, the distance between the centers of the above orthographic projections can be designed according to practical application environments, such that the reflective layer reflects the light emitted by the corresponding illuminated light-emitting structure onto the corresponding photoelectric detector.

Further, during specific implementation, the material of the cathode can include transparent conductive materials, such that the light emitted by the light-emitting layer can transmit through the cathode. During specific implementation, the material of the reflective layer can include metal materials with a high reflectivity, such as gold, silver and aluminum. In this way, in order to insulate the reflective layer from the cathode, a first interlayer insulating layer can further be arranged between the reflective layer and the cathode.

In order to reduce the influence of the reflective layer on the display effect, during specific implementation, in the embodiment of the present disclosure, the orthographic projection of the pixel defining layer on the electroluminescent display panel covers the orthographic projection of the reflective layer on the electroluminescent display panel, thereby avoiding influence of the reflective layer on the display effect of the electroluminescent display panel.

Figure 6:
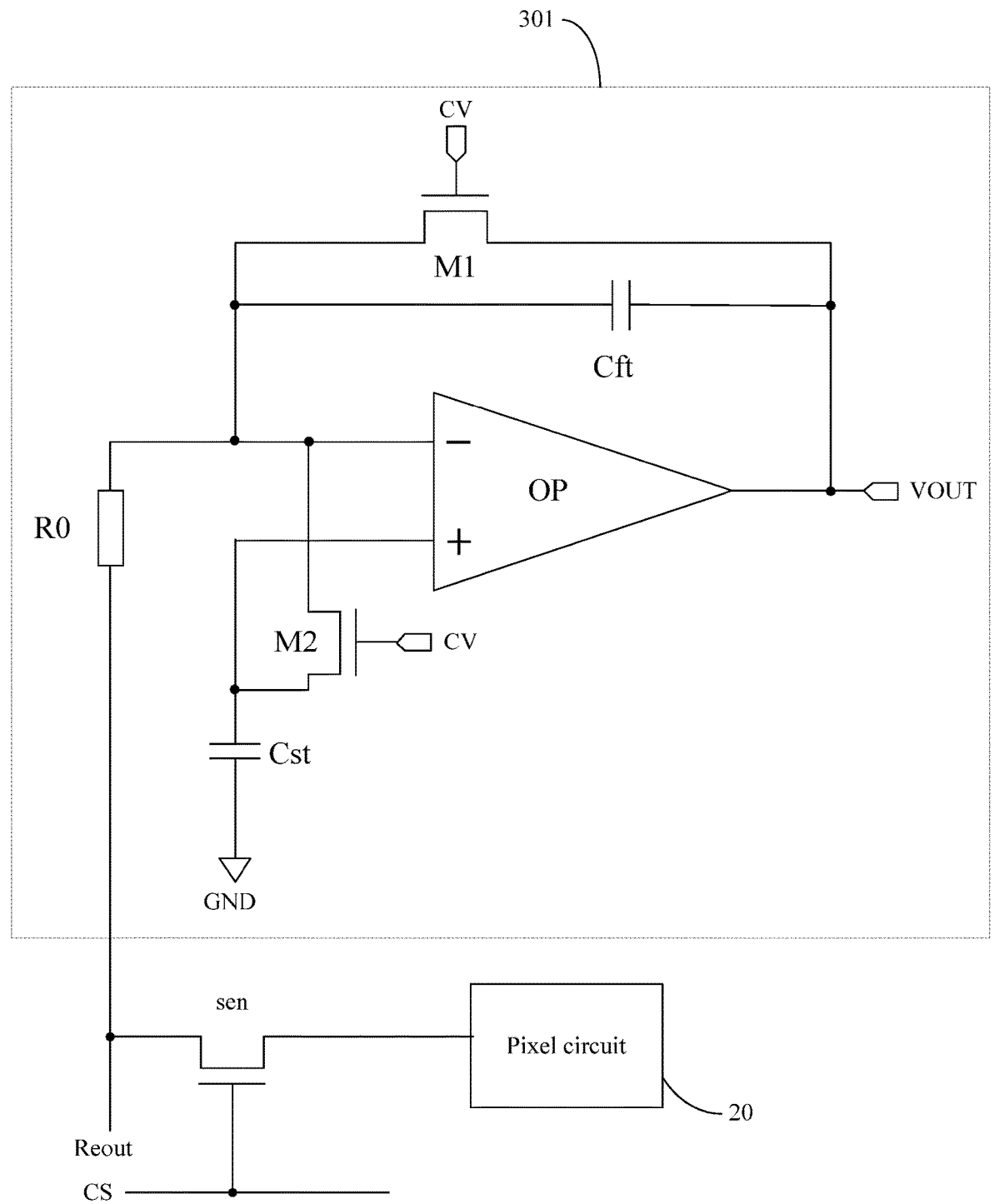
FIG. 6 is a structural schematic diagram of a voltage acquisition circuit provided in an embodiment of the present disclosure.

Further, during specific implementation, the electroluminescent display panel provided in the embodiment of the present disclosure can further include: a voltage acquisition circuit arranged corresponding to each detection output line Reout. Specifically, as shown in FIG. 6, the voltage acquisition circuit 301 can include: a reference resistor R0, a first switch transistor M1, a second switch transistor M2, an operational amplifier OP, an integrating capacitor Cft, and a storage capacitor Cst, where a first end of the reference resistor R0 is electrically connected with the corresponding detection output line Reout, a second end of the reference resistor R0 is respectively electrically connected with a first electrode of the first switch transistor M1, a first electrode of the second switch transistor M2, a first electrode of the integrating capacitor Cft and an inverting input end of the operational amplifier OP. A gate of the first switch transistor M1 is configured to receive acquisition control signals CV, and a second electrode of the first switch transistor M1 is respectively electrically connected with a second end of the integrating capacitor Cft, an output end of the operational amplifier OP and the detection voltage output end VOUT, and is configured to output first detection voltage and second detection voltage. A gate of the second switch transistor M2 is configured to receive the acquisition control signals CV, and a second electrode of the second switch transistor M2 is respectively electrically connected with a first end of the storage capacitor Cst and an in-phase input end of the operational amplifier OP; and a second end of the storage capacitor Cst is connected with a grounded end GND. Here the capacitance of the integrating capacitor Cft is the same as the capacitance of the storage capacitor Cst, and both capacitances are $c_0$.

Further, during specific implementation, in the embodiment of the present disclosure, as shown in FIG. 2 and FIG. 3, the electroluminescent display panel can further include a driver chip 300. Further, the driver chip 300 can be an integrated circuit (IC) jointly realized through software and hardware.

During specific implementation, the driver chip can be specifically configured to, for the light-emitting structures of each color, control each light-emitting structure of the color to be extinguished, and acquire first detection voltage corresponding to the connected photoelectric detector connecting the detection output line corresponding to the light-emitting structure of the color; control each light-emitting structure of the color to be illuminated, and acquire second detection voltage corresponding to the photoelectric detector connecting the detection output line corresponding to the light-emitting structure of the color; and determine the present current variation corresponding to each photoelectric detector according to the first detection voltage and the second detection voltage corresponding to the photoelectric detector corresponding to each light-emitting structure of the color.

Figure 7:
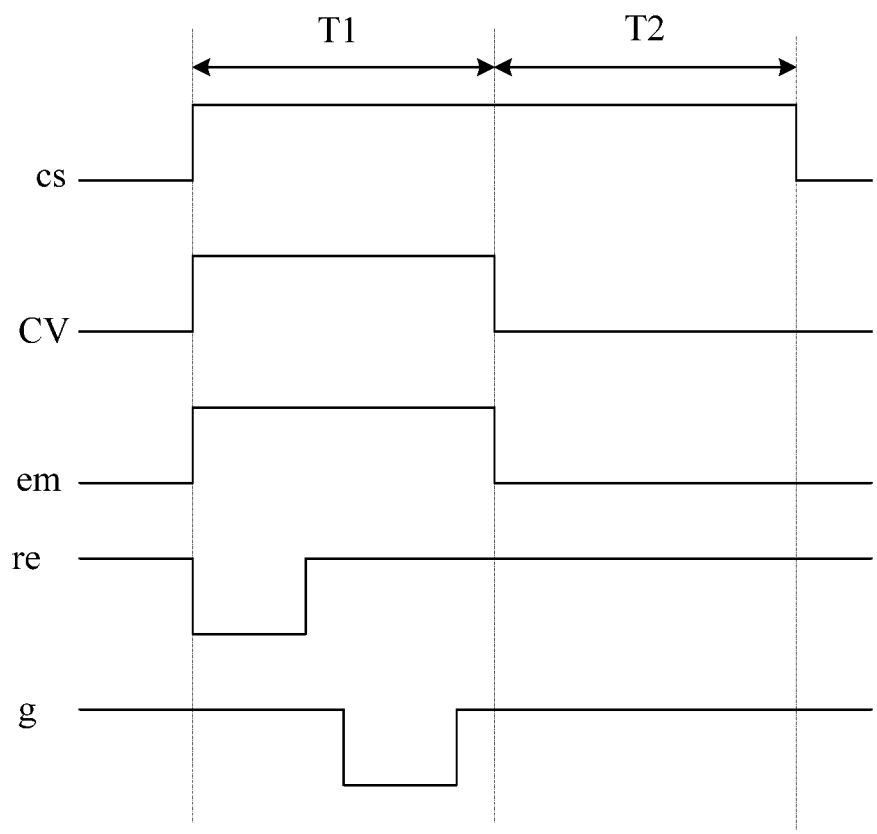
FIG. 7 is a timing diagram of signals provided in an embodiment of the present disclosure.

Optionally, in the electroluminescent display panel provided in the embodiment of the present disclosure, the voltage acquisition circuit can be integrated in the driver chip, moreover, the acquisition control signals CV, the sampling control signals cs transmitted by the sampling control line CS, the gate scanning signals g transmitted by the gate line G, the light-emitting control signals em transmitted by the light-emitting control signal line EM, and the reset signals re transmitted by the reset signal line Re can all be provided by the driver chip. Specifically, in a preset detection stage, the timing diagram of each of the above signals is as shown in FIG. 7. Of course, the data signals transmitted by the data line, the initialization signals transmitted by the initialization signal line, the high-voltage signals transmitted by the high-voltage power line, and the low-voltage signals transmitted by the low-voltage power line can all be provided by the driver chip, which is not defined herein.

The structure shown in FIG. 6 is taken as an example below, and the present disclosure is illustrated in combination with the structural schematic diagram shown in FIG. 4 and the timing diagram shown in FIG. 7. In stage T1, the detection voltage output end VOUT outputs the first detection voltage V1; in stage T2, the detection voltage output end VOUT outputs the second detection voltage V2. Moreover, the duration of stage T1 and the duration of stage T2 are the same and are both t.

In stage T1, the OLED 10 does not emit light, and the detection voltage output end VOUT outputs first detection voltage V1. Specifically, firstly, the second transistor Tr2 is turned off under the control of the light-emitting control signals em, and the first transistor Tr1 is turned off under the control of the gate scanning signals g. The third transistor Tr3 is turned on under the control of the reset signals re, to provide the initialization signals to the anode of the OLED 10 and perform initialization on the anode of the OLED 10. Afterwards, the second transistor Tr2 is turned off under the control of the light-emitting control signals em, and the third transistor Tr3 is turned off under the control of the reset signals re. The first transistor Tr1 is turned on under the control of the gate scanning signals g, to provide data signals to the gate of the drive transistor DT0. Moreover, in stage T1, the first switch transistor M1 and the second switch transistor M2 are turned on under the action of the acquisition control signals CV. The photoelectric detector sen is turned on under the control of the sampling control signals cs, to produce current $I_1$ corresponding OLED 10 without emitting light, and the current $I_1$ charges the storage capacitor Cst through the detection output line Reout and the reference resistor R0, such that the in-phase input end and the inverting input end of the operational amplifier OP acquire the same current $I_1$, and further the first detection voltage V1 output by the detection voltage output end VOUT satisfies the following formula:

$$V_1 = \frac{1}{c_0} \int_0^t I_1(t) dt.$$

In stage T2, the OLED 10 emits light, and the detection voltage output end VOUT outputs the second detection voltage V2. Specifically, the first transistor Tr1 is turned off under the control of the gate scanning signals g, and the third transistor Tr3 is turned off under the control of the reset signals re. The second transistor Tr2 is turned on under the control of the light-emitting control signals em, to provide the high-voltage signals transmitted by the high-voltage power line VDD to the drain of the drive transistor DT0, such that the drive transistor DT0 produces, under the control of the gate voltage and the source voltage, current $I_{OLED}$ which drives the OLED 10 to emit light, so as to drive the OLED to emit light. Moreover, in stage T2, the first switch transistor M1 and the second switch transistor M2 are turned off under the action of the acquisition control signals CV. The photoelectric detector sen is turned on under the control of the sampling control signals cs, to detect the light emitted by the OLED 10 through the reflecting action of the reflective layer, such that the current output by the photoelectric detector sen is $I_1+I_2$; where $I_2$ represents the variation current produced due to photoelectric conversion of the photoelectric detector sen when the OLED 10 emits light, and the current $I_1+I_2$ charges the integrating capacitor Cft through the detection output line Reout and the reference resistor R0, such that the inverting input end of the operational amplifier OP acquires the current $I_1+I_2$, and further the second detection voltage V2 output by the detection voltage output end VOUT satisfies the following formula:

$$V_2 = V1 - \frac{1}{c_0} \int_0^t [I_1(t) + I_2(t)] dt.$$

In this way, through the driver chip and according to the formulas satisfied by the first detection voltage V1 and the second detection voltage V2, $c_0 V_2 = \int_0^t I_2(t)\, dt$ can be obtained, that is, the present current variation of the photoelectric detector sen can be obtained. Afterwards, the driver chip determines the initial data voltage corresponding to each present current variation according to the predetermined correspondence table of the initial current variation and initial data voltage and the acquired present current variation corresponding to each photoelectric detector. Afterwards, the voltage difference between each initial data voltage and corresponding present data voltage is determined. Then when the electroluminescent display panel displays images, images are displayed according to the determined voltage difference and the data voltage for displaying images. Where, for the specific implementation process of the driver chip, please refer to embodiment 1 and embodiment 2, and the specific implementation process will not be repeated redundantly herein.

It should be noted that, the transistors mentioned in the embodiments of the present disclosure are all illustrated with the N-type transistors as an example. The above conditions in which the transistors are P-type transistors also all belong to the protection scope of the present disclosure, and are not limited herein. Moreover, according to the type of transistors, the first electrode of the above transistor can be taken as a source, and a second electrode can be taken as a drain, or the first electrode of the above transistor can be taken as a drain, and the second electrode can be taken as a source, which needs to be designed and determined according to actual application environments, and is not defined herein.

Based on the same inventive concept, the embodiment of the present disclosure further provides a brightness compensation method applicable to the above electroluminescent display panel, and the brightness compensation method is used for compensating the brightness of the electroluminescent display panel.

Figure 8:
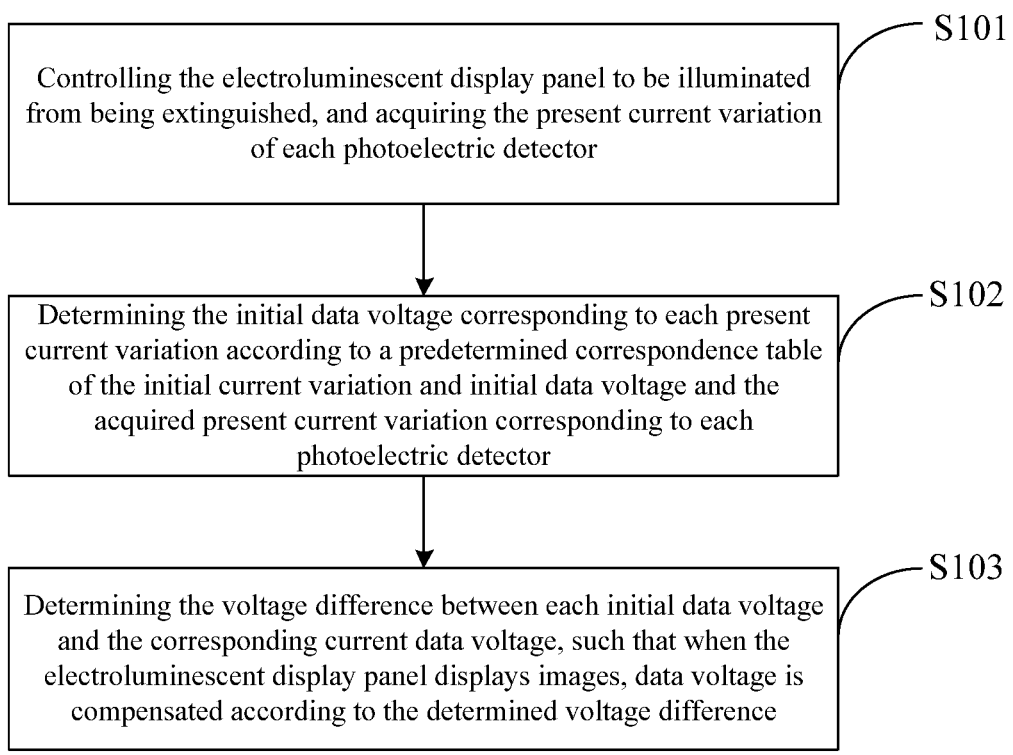
FIG. 8 is a flow chart of a brightness compensation method provided in an embodiment of the present disclosure.

The embodiment of the present disclosure provides a brightness compensation method, as shown in FIG. 8, the method can include the following steps.

S101, controlling the electroluminescent display panel to be illuminated from being extinguished, and acquiring the present current variation of each photoelectric detector, where each light-emitting structure is configured to be illuminated when the current data voltage is applied.

Here, each light-emitting structure is configured to be illuminated when the current data voltage is applied. That is to say, the current data voltage applied when each light-emitting structure is illuminated corresponds to the present current variation of the photoelectric detector corresponding to the light-emitting structure. Moreover, gray-scale values generally represent levels of different brightness ranging from the darkest to the brightest, for example, 256 gray-scale values. During practical applications, the current data voltage can be the data voltage corresponding to any gray-scale value selected according to experience, for example, the current data voltage can be the data voltage corresponding to 255 gray-scale values.

The photoelectric detector can generally convert the light emitted by the corresponding light-emitting structure into electric signals, and when the light-emitting structure corresponding to the photoelectric detector does not emit light, the photoelectric detector can have background current. When the light-emitting structure corresponding to the photoelectric detector emits light, the photoelectric detector can convert the light emitted by the corresponding light-emitting structure into electric signals, such that in the process in which the electroluminescent display panel is illuminated from being extinguished, the light-emitting structure is illuminated from being extinguished, the current generated by the photoelectric detector will change relative to the background current, and the changed current is related to the brightness of the light-emitting structure, therefore, the present current variation of the photoelectric detector can represent the brightness of the corresponding light-emitting structure.

Further, the light-emitting structures of each color are controlled in sequence to be illuminated from being extinguished, to acquire the present current variation of the photoelectric detector corresponding to the light-emitting structure of each color. For example, the light-emitting structure can include a red light-emitting structure, a green light-emitting structure and a blue light-emitting structure, then the red light-emitting structure can be firstly controlled to be illuminated from being extinguished, to acquire the present current variation of the photoelectric detector corresponding to the red light-emitting structure, then the green light-emitting structure can be controlled to be illuminated from being extinguished, to acquire the present current variation of the photoelectric detector corresponding to the green light-emitting structure, and finally the blue light-emitting structure can be controlled to be illuminated from being extinguished, to acquire the present current variation of the photoelectric detector corresponding to the blue light-emitting structure.

S102, determining the initial data voltage corresponding to each present current variation according to a predetermined correspondence table of the initial current variation and initial data voltage and the acquired present current variation corresponding to each photoelectric detector.

Specifically, the initial data voltage corresponding to the initial current variation equal to the present current variation is just the initial data voltage corresponding to the present current variation. Moreover, for each light-emitting structure corresponding to the photoelectric detector, before the light-emitting structure is not aged, the light-emitting structure is controlled to be illuminated from being extinguished, the current variation of the photoelectric detector corresponding to the light-emitting structure is just the initial current variation, and the data voltage input correspondingly when the light-emitting structure is illuminated is just the initial data voltage.

S103, determining the voltage difference between each initial data voltage and the corresponding current data voltage, such that when the electroluminescent display panel displays images, data voltage is compensated according to the determined voltage difference.

Specifically, the voltage difference ΔVdata satisfies the following formula: ΔVdata=Vdata1-Vdata0; where Vdata1 represents the current data voltage corresponding to the present current variation, and Vdata0 represents the initial data voltage corresponding to the present current variation.

When the electroluminescent display panel displays images, the absolute value |Vdata1-Vdata0| of the voltage difference is added to the data voltage Vdata2 used for displaying images, to obtain a new data voltage Vdata2+|Vdata1-Vdata0|, so as to control the electroluminescent display panel to display through the new data voltage.

In the above brightness compensation method provided in the embodiment of the present disclosure, the electroluminescent display panel is controlled to be illuminated from being extinguished, to acquire the present current variation of each photoelectric detector, so as to determine the initial data voltage corresponding to each present current variation and determine the voltage difference between each initial data voltage and the corresponding current data voltage according to a predetermined correspondence table of the initial current variation and the initial data voltage and the acquired present current variation corresponding to each photoelectric detector, therefore, when the electroluminescent display panel displays images, data voltage is compensated according to the determined voltage difference, thereby compensating brightness of the electroluminescent display panel, and improving display effect.

Specifically, the data voltage for displaying images can be added with the determined absolute value of the voltage difference to obtain a new data voltage, so as to control the electroluminescent display panel to display according to the new data voltage. Since the new data voltage used for image display is increased compared with the original data voltage, the current which drives the OLED to emit light is increased, and the light-emitting brightness of the OLED is increased, thereby compensating the brightness of the electroluminescent display panel, and improving display effect.

The electroluminescent display panel can be generally applied to display devices (for example, a mobile phone, a desktop computer, a portable android device (Pad), a television, a display, a notebook computer, a digital photo frame, a navigator and any other product or device with a display function), and is configured to display various pictures. After the display device is turned on, when the electroluminescent display panel is normally used, the electroluminescent display panel can display various images for viewing, such as a static desktop, picture or a dynamic video. When the display device is turned on or turned off, solid-color pictures or mobile phone brand identities, rather than images, are generally displayed. Therefore, step S101 to step S103 in the above brightness compensation method can be performed in the period when the display device is turned on or turned off, to determine the voltage difference between each initial data voltage and corresponding current data voltage, such that when the electroluminescent display panel displays images, the data voltage for displaying the image can be added with the determined absolute value of the voltage difference to obtain a new data voltage, to control the electroluminescent display panel to display.

During specific implementation, in the embodiment of the present disclosure, the step of controlling the electroluminescent display panel to be illuminated from being extinguished, and acquiring the present current variation of each photoelectric detector can specifically include:

for the light-emitting structures of each color, controlling the light-emitting structures of the color to be extinguished, and acquiring first detection voltage corresponding to the photoelectric detector connected to the detection output line corresponding to the light-emitting structures of the color;

controlling each light-emitting structure of the color to be illuminated, and acquiring second detection voltage corresponding to the photoelectric detector connected to the detection output line corresponding to the light-emitting structures of the color; and determining the present current variation corresponding to each photoelectric detector according to the first detection voltage and the second detection voltage corresponding to the photoelectric detector corresponding to the light-emitting structure of the color, to obtain the present current variation corresponding to the photoelectric detector corresponding to the light-emitting structures of each color.

The present disclosure will be described in detail below in combination with specific embodiments. It should be noted that, the embodiment intends to better explain the present disclosure, rather than limiting the present disclosure.

The aging degrees of OLEDs in different light-emitting structures are generally different. In one embodiment, each light-emitting structure corresponding to the photoelectric detector can be in one-to-one correspondence with one predetermined correspondence table of the initial current variation and the initial data voltage. In the embodiment of the present disclosure, the step of determining the initial data voltage corresponding to each present current variation can specifically include: determining the initial data voltage corresponding to each present current variation according to the predetermined correspondence table of the initial current variation and the initial data voltage which is in one-to-one correspondence with each light-emitting structure corresponding to the photoelectric detector and according to the acquired present current variation of each photoelectric detector. Since each light-emitting structure corresponding to the photoelectric detector corresponds to one present current variation, and each light-emitting structure corresponding to the photoelectric detector is in one-to-one correspondence with a correspondence table, the determined initial data voltage corresponding to each present current variation is more accurate, thereby improving accuracy of brightness compensation.

During practical applications, the photoelectric detector in the electroluminescent display panel will be influenced by the brightness of ambient light. In order to reduce the influence of the ambient light on brightness compensation, during specific implementation, the predetermined correspondence table of the initial current variation and initial data voltage can include multiple sub-correspondence tables of the initial current variation and the initial data voltage corresponding to different ambient brightness ranges.

Specifically, K different ambient brightness ranges can be set: [L0+(k−1)*ΔL, L0+k*ΔL), where K≥1 and K is an integer, moreover, 1≤k≤K and k is an integer, L0≥0 and ΔL>0. For example, when K=5, there are five different ambient brightness ranges as: [L0, L0+1ΔL), [L0+1ΔL, L0+2ΔL), [L0+2ΔL, L0+3ΔL), [L0+3ΔL, L0+4ΔL), [L0+4ΔL, L0+5ΔL). In this way, [L0, L0+1ΔL) can correspond to one sub-correspondence table of the initial current variation and the initial data voltage, [L0+1ΔL, L0+2ΔL) can correspond to one sub-correspondence table of the initial current variation and the initial data voltage, [L0+2ΔL, L0+3ΔL) can correspond to one sub-correspondence table of the initial current variation and the initial data voltage, [L0+3ΔL, L0+4ΔL) can correspond to one sub-correspondence table of the initial current variation and the initial data voltage, and [L0+4ΔL, L0+5ΔL) can correspond to one sub-correspondence table of the initial current variation and the initial data voltage. Moreover, during practical applications, the ambient brightness corresponding to different application environments is different. Through setting the ambient brightness range with multiple gradients, the sub-correspondence table of the initial current variation and the initial data voltage can be set according to the ambient brightness range, so as to reduce the influence of the ambient light on brightness compensation, and enable the brightness compensation to be more accurate. Moreover, specific numerical values of L0 and ΔL can be designed and determined according to actual application environments, and are not limited herein. During specific implementation, K can be set to be 1, 2, 3, 5 or 8, and is not limited herein. K=5 is taken as an example for illustration below.

Generally, before delivery of an electroluminescent display panel which is a qualified product, since the electroluminescent display panel is not used for a long time, the light-emitting structure can be deemed as unaged. During specific implementation, in the embodiment of the present disclosure, the method for establishing sub-correspondence tables of the initial current variation and the initial data voltage corresponding to different ambient brightness ranges includes: the electroluminescent display panel before delivery is placed in preset ambient light with multiple different brightness ranges; where a brightness value is selected in each ambient light with a preset brightness range, when the electroluminescent display panel is placed in each ambient light with a selected brightness value, the light-emitting structures of each color are controlled in sequence to be illuminated from being extinguished under the control of the preselected data voltage, to acquire the current variation of each photoelectric detector. In this way, in each ambient light with a selected brightness value, when each light-emitting structure corresponding to the photoelectric detector is controlled to be illuminated from being extinguished under the control of the preselected data voltage, current variation corresponding to the preselected data voltage can be generated, therefore, for each light-emitting structure corresponding to the photoelectric detector, the sub-correspondence table of the initial current variation and initial data voltage corresponding to different ambient brightness ranges is established according to each preset brightness range, the current variation acquired in each preset ambient brightness range, and the preselected data voltage corresponding to the current variation. Where, the above preselected data voltage is the same as the current data voltage in step S101.

In order to determine the ambient brightness value of the environment in which the electroluminescent display panel is located, during specific implementation, in the embodiment of the present disclosure, before controlling the electroluminescent display panel to be illuminated from being extinguished, and acquiring the present current variation of each photoelectric detector, the method can further include:

detecting the current ambient brightness value of the environment in which the electroluminescent display panel is located; and determining a sub-correspondence table corresponding to the current ambient brightness value according to the current ambient brightness value and the ambient brightness range. Specifically, when the detected current ambient brightness value is within the ambient brightness range [L0+3ΔL, L0+4ΔL), the sub-correspondence table of the initial current variation and the initial data voltage corresponding to [L0+3ΔL, L0+4ΔL) can be taken as a sub-correspondence table of the initial current variation and the initial data voltage corresponding to the current ambient brightness value.

The electroluminescent display panel is generally applied to the display device, and a photosensitive probe can also be arranged in the display device, therefore, the ambient brightness value of the environment in which the electroluminescent display panel is located can be detected through the photosensitive probe. Or, the ambient brightness value of the environment in which the electroluminescent display panel is located can also be detected through a photosensitive device which is arranged in the electroluminescent display panel in advance, which is not limited herein.

Further, during specific implementation, in the embodiment of the present disclosure, the step of determining the initial data voltage corresponding to each present current variation can specifically include:

determining the initial data voltage corresponding to each present current variation according to a determined sub-correspondence table corresponding to the current ambient brightness value and the acquired present current variation corresponding to each photoelectric detector, thereby reducing influence of the ambient light on brightness compensation, and improving accuracy of brightness compensation.

The brightness compensation method provided in the embodiment of the present disclosure will be illustrated below through embodiments with K=5 and the light-emitting structure including a red light-emitting structure, a green light-emitting structure and a blue light-emitting structure as an example, however, readers should understand that, the specific process is not limited herein.

Figure 9:
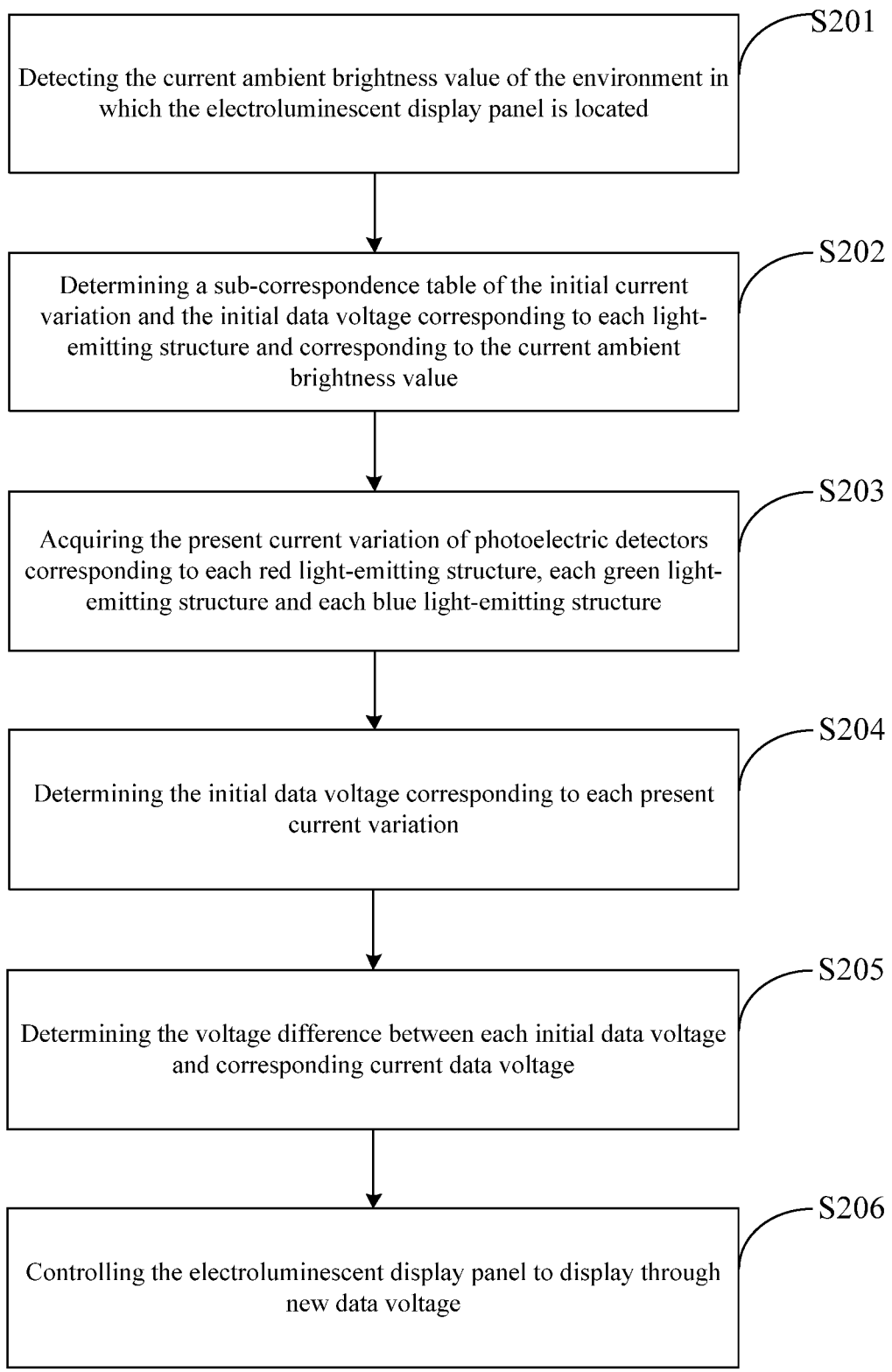
FIG. 9 is a specific flow chart of a brightness compensation method provided in an embodiment of the present disclosure.

As shown in FIG. 9, the brightness compensation method provided in the embodiment of the present disclosure can include the following steps.

S201, detecting the current ambient brightness value L1 of the environment in which the electroluminescent display panel is located.

Specifically, the current ambient brightness value L1 of the environment in which the electroluminescent display panel is located can be detected by a photosensitive probe.

S202, for each light-emitting structure corresponding to the photoelectric detector, when the current ambient brightness value L1 is within an ambient brightness range of [L0+3ΔL, L0+4ΔL), determining the sub-correspondence table of the initial current variation and the initial data voltage corresponding to [L0+3ΔL, L0+4ΔL) in the correspondence table corresponding to each light-emitting structure to be a sub-correspondence table of the initial current variation and the initial data voltage corresponding to each light-emitting structure and corresponding to the current ambient brightness value L1.

S203, controlling in sequence each red light-emitting structure, each green light-emitting structure and each blue light-emitting structure to be illuminated from being extinguished under the action of the current data voltage, to acquire the present current variation of photoelectric detectors corresponding to each red light-emitting structure, each green light-emitting structure and each blue light-emitting structure. Here, each light-emitting structure is configured to be illuminated under the effect of the current data voltage Vdata1.

Specifically, the step of controlling each red light-emitting structure to be illuminated from being extinguished under the action of the current data voltage and acquiring the present current variation of the photoelectric detector corresponding to each red light-emitting structure is taken as an example for illustration: each red light-emitting structure is controlled to be extinguished, and the first detection voltage corresponding to the photoelectric detector connected to the detection output line corresponding to each red light-emitting structure is acquired; then each red light-emitting structure is controlled to be illuminated, and the second detection voltage corresponding to the photoelectric detector connected to the detection output line corresponding to each red light-emitting structure is acquired; and then the present current variation corresponding to the photoelectric detector corresponding to each red light-emitting structure is determined according to the first detection voltage and the second detection voltage corresponding to the photoelectric detector corresponding to each red light-emitting structure. Similarly, the present current variation corresponding to the photoelectric detector corresponding to each green light-emitting structure and the present current variation corresponding to the photoelectric detector corresponding to each blue light-emitting structure can be obtained.

S204, determining the initial data voltage Vdata0 corresponding to each present current variation according to the predetermined sub-correspondence table corresponding to the current ambient brightness value corresponding to each light-emitting structure and the acquired present current variation corresponding to each photoelectric detector.

S205, determining the voltage difference ΔVdata between each initial data voltage and corresponding current data voltage, where ΔVdata=Vdata1−Vdata0. Where it should be noted that, since the attenuation of different light-emitting structures is different, the current variations corresponding to different light-emitting structures are different, therefore, ΔVdata corresponding to each light-emitting structure may also be different.

S206, adding the absolute value |Vdata1−Vdata0| of the voltage difference to the data voltage Vdata2 used for displaying images, to obtain a new data voltage Vdata2+|Vdata1−Vdata0 |, so as to control the electroluminescent display panel to display through the new data voltage Vdata2+|Vdata1−Vdata0|.

In the above brightness compensation method provided in the embodiment of the present disclosure, since the new data voltage used for image display is increased compared with the original data voltage Vdata2, the current which drives the OLED to emit light is increased, and the light-emitting brightness of the OLED is increased, thereby improving the brightness of the electroluminescent display panel, and improving display effect.

In another embodiment, the light-emitting structures of the same color can be taken as a whole, such that the light-emitting structures of the same color correspond to one predetermined correspondence table of the initial current variation and the initial data voltage. For example, when the light-emitting structure includes a red light-emitting structure, a green light-emitting structure and a blue light-emitting structure, all the red light-emitting structures in the electroluminescent display panel correspond to the same predetermined correspondence table of the initial current variation and the initial data voltage, all the green light-emitting structures correspond to the same predetermined correspondence table of the initial current variation and the initial data voltage, and all the blue light-emitting structures correspond to the same predetermined correspondence table of the initial current variation and the initial data voltage, thereby reducing the predetermined correspondence tables, saving storage space, and simplifying method steps.

It should be noted that, the embodiment is a variant with part of the implementation manners of the above embodiments being changed. Merely differences between the present embodiment and the above embodiments are described below, and the same parts are not repeated redundantly herein.

Further, during specific implementation, in the embodiment of the present disclosure, the step of determining the initial data voltage corresponding to each present current variation can specifically include:

for each light-emitting structure of the same color, determining the initial data voltage corresponding to each present current variation according to a predetermined correspondence table of the initial current variation and initial data voltage corresponding to the light-emitting structures of the color and according to the acquired present current variation corresponding to each photoelectric detector.

Further, during specific implementation, the predetermined correspondence table of the initial current variation and the initial data voltage can include: multiple predetermined sub-correspondence tables of the initial current variation and the initial data voltage corresponding to different ambient brightness ranges; that is, all the red light-emitting structures correspond to multiple predetermined sub-correspondence tables of the initial current variation and the initial data voltage corresponding to different ambient brightness ranges, all the green light-emitting structures correspond to multiple predetermined sub-correspondence tables of the initial current variation and the initial data voltage corresponding to different ambient brightness ranges, and all the blue light-emitting structures correspond to multiple predetermined sub-correspondence tables of the initial current variation and the initial data voltage corresponding to different ambient brightness ranges. Specifically, with the multiple predetermined sub-correspondence tables of the initial current variation and the initial data voltage corresponding to different ambient brightness ranges corresponding to the red light-emitting structure as an example, K different ambient brightness ranges can be set: [L0+(k−1)*ΔL, L0+k*ΔL), where k≥1 and K is an integer, moreover, 1≤k≤K and k is an integer, L0≥0 and ΔL>0. For example, when K=5, five different ambient brightness ranges can be available: [L0, L0+1ΔL), [L0+1ΔL, L0+2ΔL), [L0+2ΔL, L0+3ΔL), [L0+3ΔL, L0+4ΔL), [L0+4ΔL, L0+5ΔL). In this way, [L0, L0+1ΔL) can correspond to one sub-correspondence table of the initial current variation and the initial data voltage, [L0+1ΔL, L0+2ΔL) can correspond to one sub-correspondence table of the initial current variation and the initial data voltage, [L0+2ΔL, L0+3ΔL) can correspond to one sub-correspondence table of the initial current variation and the initial data voltage, [L0+3ΔL, L0+4ΔL) can correspond to one sub-correspondence table of the initial current variation and the initial data voltage, and [L0+4ΔL, L0+5ΔL) can correspond to one sub-correspondence table of the initial current variation and the initial data voltage. Moreover, during practical applications, the ambient brightness corresponding to different application environments is different. Through setting the ambient brightness range with multiple gradients, the sub-correspondence table of the initial current variation and the initial data voltage can be set according to the ambient brightness range, so as to reduce the influence of the ambient light on brightness compensation, and enable the brightness compensation to be more accurate. Moreover, specific numerical values of L0 and ΔL can be designed and determined according to actual application environments, and are not limited herein. During specific implementation, K can be set to be 1, 2, 3, 5 or 8, and is not limited herein.

In the embodiment of the present disclosure, before controlling the electroluminescent display panel to be illuminated from being extinguished, and acquiring the present current variation of each photoelectric detector, the method further includes:

detecting the current ambient brightness value of the environment in which the electroluminescent display panel is located;

for each light-emitting structure corresponding to the photoelectric detector, determining the sub-correspondence table corresponding to the current ambient brightness value according to the current ambient brightness value and the ambient brightness range, thereby determining which sub-correspondence table needs to be adopted for brightness compensation, and improving accuracy of brightness compensation.

Further, during specific implementation, the step of determining the initial data voltage corresponding to each present current variation can specifically include:

the initial data voltage corresponding to each present current variation is determined according to the determined sub-correspondence table corresponding to the current ambient brightness value and the acquired present current variation corresponding to each photoelectric detector. For example, for each red light-emitting structure, the initial data voltage corresponding to the present current variation corresponding to each photoelectric detector is determined according to the sub-correspondence table corresponding to the red light-emitting structure and corresponding to the current ambient brightness value and according to the acquired present current variation corresponding to the photoelectric detector corresponding to each red light-emitting structure.

The brightness compensation method provided in the embodiment of the present disclosure will be illustrated below through embodiments with K=5 and the light-emitting structure including a red light-emitting structure, a green light-emitting structure and a blue light-emitting structure as an example, however, readers should understand that, the specific process is not limited herein.

Figure 10:
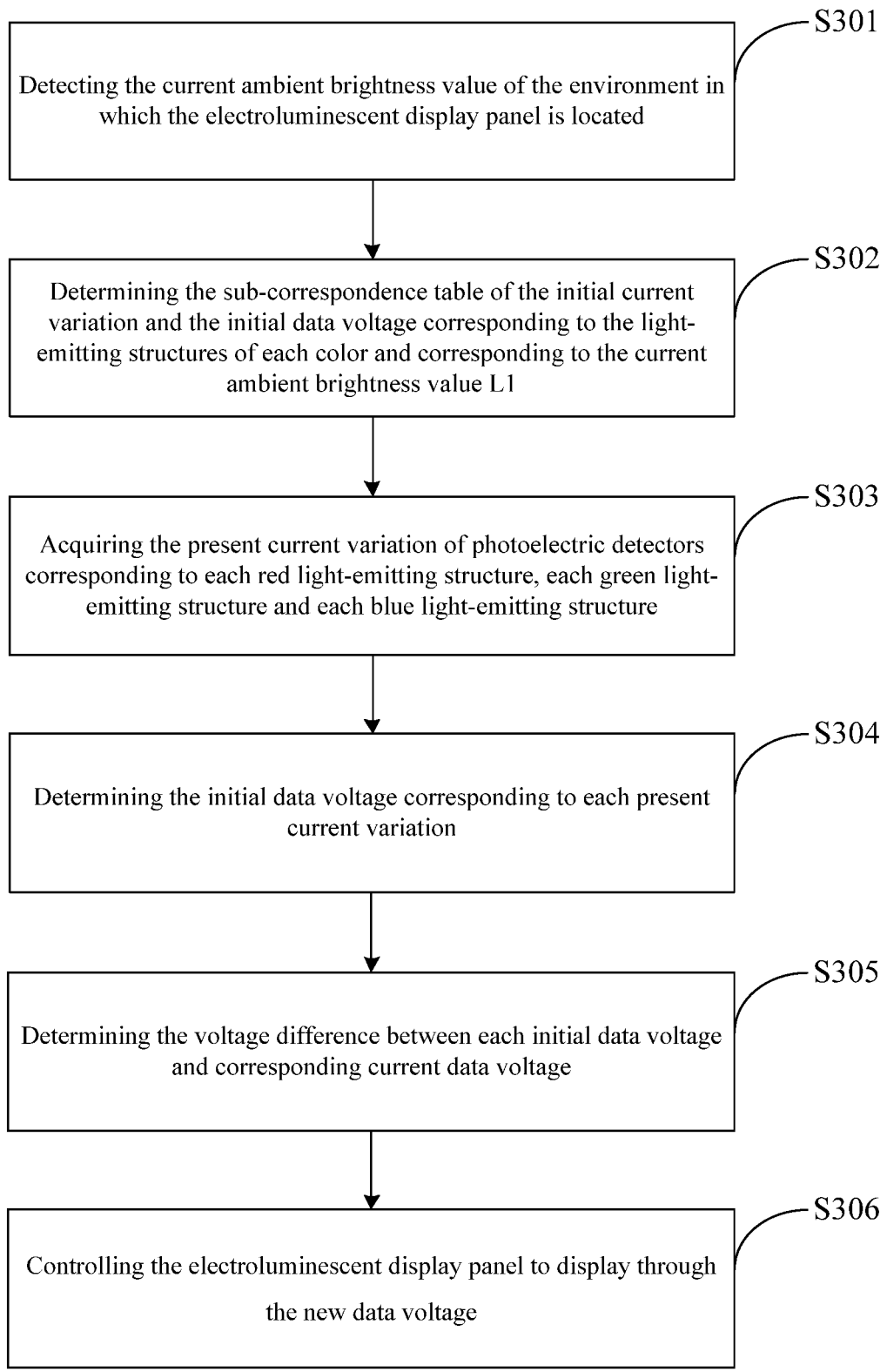
FIG. 10 is a specific flow chart of a brightness compensation method provided in another embodiment of the present disclosure.

As shown in FIG. 10, a brightness compensation method provided in the embodiment of the present disclosure can include the following steps.

S301, detecting the current ambient brightness value L1 of the environment in which the electroluminescent display panel is located.

Specifically, the current ambient brightness value L1 of the environment in which the electroluminescent display panel is located can be detected by a photosensitive probe.

S302, for each red light-emitting structure corresponding to the photoelectric detector, when the current ambient brightness value L1 is within the ambient brightness range [L0+3ΔL, L0+4ΔL), determining the sub-correspondence table corresponding to the initial current variation and the initial data voltage corresponding to [L0+3ΔL, L0+4ΔL) in the correspondence table corresponding to the red light-emitting structure to be a sub-correspondence table of the initial current variation and the initial data voltage corresponding to the red light-emitting structure and corresponding to the current ambient brightness value L1. Similarly, the sub-correspondence table of the initial current variation and the initial data voltage corresponding to the green light-emitting structure and corresponding to the current ambient brightness value L1 can be obtained, and the sub-correspondence table of the initial current variation and the initial data voltage corresponding to the blue light-emitting structure and corresponding to the current ambient brightness value L1 can also be obtained, so as to determine the sub-correspondence table of the initial current variation and the initial data voltage corresponding to the light-emitting structures of each color and corresponding to the current ambient brightness value L1.

S303, controlling in sequence each red light-emitting structure, each green light-emitting structure and each blue light-emitting structure to be illuminated from being extinguished under the action of the current data voltage, to acquire the present current variation of photoelectric detectors corresponding to each red light-emitting structure, each green light-emitting structure and each blue light-emitting structure.

Specifically, the step of controlling each red light-emitting structure to be illuminated from being extinguished under the effect of the current data voltage and acquiring the present current variation of the photoelectric detector corresponding to each red light-emitting structure is taken as an example for illustration: each red light-emitting structure is controlled to be extinguished, and the first detection voltage corresponding to the photoelectric detector connected to the detection output line corresponding to each red light-emitting structure is acquired; then each red light-emitting structure is controlled to be illuminated, and the second detection voltage corresponding to the photoelectric detector connected to the detection output line corresponding to each red light-emitting structure is acquired; and then the present current variation corresponding to the photoelectric detector corresponding to each red light-emitting structure is determined according to the first detection voltage and the second detection voltage corresponding to the photoelectric detector corresponding to each red light-emitting structure.

Similarly, the present current variation corresponding to the photoelectric detector corresponding to each green light-emitting structure can be obtained, and the present current variation corresponding to the photoelectric detector corresponding to each blue light-emitting structure can also be obtained.

S304, determining the initial data voltage Vdata0 corresponding to each present current variation according to the predetermined sub-correspondence tables corresponding to the current ambient brightness value corresponding to the red light-emitting structure, the green light-emitting structure and the blue light-emitting structure and according to the acquired present current variation of each photoelectric detector corresponding to the red light-emitting structure, the green light-emitting structure and the blue light-emitting structure.

S305, determining the voltage difference between each initial data voltage and corresponding current data voltage, where ΔVdata=Vdata1-Vdata0. Where, it should be noted that, since the attenuation of different red light-emitting structures is different, the current variations corresponding to different red light-emitting structures are different, therefore, ΔVdata corresponding to each red light-emitting structure may also be different.

S306, adding the absolute value |Vdata 1−Vdata0| of the voltage difference to the data voltage Vdata2 used for displaying images, to obtain a new data voltage Vdata2+|Vdata1−Vdata0|, so as to control the electroluminescent display panel to display through the new data voltage Vdata2+|Vdata1−Vdata0|.

In the above brightness compensation method provided in the embodiment of the present disclosure, since the new data voltage used for image display is increased compared with the original data voltage Vdata2, the current which drives the OLED to emit light is increased, and the light-emitting brightness of the OLED is increased, thereby improving the brightness of the electroluminescent display panel, and improving display effect.

Based on the same inventive concept, the embodiment of the present disclosure further provides a computer readable storage medium which is stored with computer programs thereon, and the above method provided in the embodiment of the present disclosure is implemented when the programs are executed by the processor.

During specific implementation, the computer readable storage medium provided in the embodiment of the present disclosure includes but is not limited to a disk memory, CD-ROM, an optical memory, etc.

Based on the same inventive concept, the embodiment of the present disclosure further provides a computer device which includes a memory, a processor and computer programs stored on the memory and capable of running on the processor, and the above method provided in the embodiment of the present disclosure can be realized when the processor executes the programs.

As to the electroluminescent display panel, the brightness compensation method, the computer readable storage medium and the computer device provided in the embodiments of the present disclosure, through setting photoelectric detectors which correspond to at least part of the light-emitting structures, the photoelectric detectors convert the light emitted when the corresponding light-emitting structure is illuminated into electric signals under the control of the sampling control line and output the electric signals to the detection output line, and the photoelectric detectors are utilized to detect the display brightness variation of the corresponding light-emitting structure, so as to perform voltage compensation on the light-emitting structure according to the detected brightness variation, and ensure the display effect of the whole display panel.

Those skilled in the art shall appreciate that the embodiments of the present disclosure can be embodied as a method, a system or a computer program product. Therefore, the present disclosure can be embodied in the form of an all-hardware embodiment, an all-software embodiment or an embodiment of software and hardware in combination. Furthermore, the present disclosure can be embodied in the form of a computer program product embodied in one or more computer useable storage mediums (including but not limited to a disk memory, CD-ROM, an optical memory, etc.) in which computer useable program codes are contained.

The present disclosure has been described in a flow chart and/or a block diagram of the method, the device (system) and the computer program product according to the embodiments of the present disclosure. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine, so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing devices to operate in a specific manner, so that the instructions stored in the computer readable memory create an article of manufacture including instruction means, and such instruction means perform the functions specified in the flow(s) of the flow chart and/or the block(s) of the block diagram.

These computer program instructions can also be loaded onto the computer or the other programmable data processing devices, such that a series of operational steps are performed on the computer or the other programmable data processing devices to produce computer-implemented processing, then the instructions executed on the computer or the other programmable devices provide steps for realizing the functions specified in the flow(s) of the flow chart and/or the block(s) of the block diagram.

Although preferred embodiments of the present disclosure have been described, once basic creative concepts are known to those skilled in the art, additional alterations and modifications can be made to these embodiments, therefore, the appended claims intend to be construed to include preferred embodiments and all the alterations and modifications falling within the scope of the present disclosure.

Evidently those skilled in the art can make various modifications and variations to the embodiment of the present disclosure without departing from the spirit and scope of the embodiment of the present disclosure. Thus the present disclosure is also intended to encompass these modifications and variations thereto so long as the modifications and variations come into the scope of the claims appended to the present disclosure and their equivalents.

The invention claimed is:

1. An electroluminescent display panel, comprising:
a plurality of pixel units, wherein each of the plurality of pixel units comprises a plurality of light-emitting structures of different colors;
photoelectric detectors arranged corresponding to at least part of the light-emitting structures; and
control signal lines and detection signal lines connected with the photoelectric detectors;
wherein the photoelectric detectors each is configured to convert light emitted by a corresponding illuminated light-emitting structure into electric signal under control of a signal of a control signal line, and to output the electric signal to a detection signal line;
wherein the photoelectric detector comprises a vertical phototransistor;
wherein a gate of the vertical phototransistor is electrically connected with the control signal line, a source of the vertical phototransistor is electrically connected with a high-voltage power line in the electroluminescent display panel, and a drain of the vertical phototransistor is electrically connected with the detection signal line;
wherein the electroluminescent display panel further comprises: a reflective layer arranged corresponding to the photoelectric detector;
wherein the reflective layer is configured to reflect the light emitted by the corresponding illuminated light-emitting structure onto the photoelectric detector;
orthographic projection of the reflective layer on the electroluminescent display panel does not overlap with either orthographic projection of the corresponding photoelectric detector on the electroluminescent display panel or orthographic projection of the corresponding light-emitting structure on the electroluminescent display panel, and is located between the orthographic projection of the corresponding photoelectric detector on the electroluminescent display panel and the orthographic projection of the corresponding light-emitting structure on the electroluminescent display panel.

2. The electroluminescent display panel of claim 1, wherein
the photoelectric detector further comprises: a filter arranged above the vertical phototransistor;
wherein color of the filter is same as color of a light-emitting structure corresponding to the photoelectric detector.

3. The electroluminescent display panel of claim 1, wherein
the pixel units each comprises: a first color light-emitting structure, a second color light-emitting structure and a third color light-emitting structure;
photoelectric detectors which are respectively corresponding to the first color light-emitting structure, the second color light-emitting structure and the third color light-emitting structure in a same pixel unit are taken as one photoelectric detection group; and
the photoelectric detection group, the first color light-emitting structure, the second color light-emitting structure and the third color light-emitting structure are arranged in a two-row and two-column array in the display panel.

4. The electroluminescent display panel of claim 1, wherein
a photoelectric detector and a corresponding light-emitting structure are arranged adjacently along a column direction.

5. The electroluminescent display panel of claim 1, wherein
photoelectric detectors, arranged in a same column and corresponding to light-emitting structures of same color, are connected with a same detection signal line; and
photoelectric detectors arranged in a same row are connected with a same control signal line.

6. The electroluminescent display panel of claim 1, wherein
the electroluminescent display panel further comprises:
a voltage acquisition circuit arranged corresponding to each detection signal line;
wherein the voltage acquisition circuit comprises: a reference resistor, a first switch transistor, a second switch transistor, an operational amplifier, an integrating capacitor, and a storage capacitor, wherein,
a first end of the reference resistor is electrically connected with a corresponding detection signal line, a second end of the reference resistor is respectively electrically connected with a first electrode of the first switch transistor, a first electrode of the second switch transistor, a first electrode of the integrating capacitor and an inverting input end of the operational amplifier;
a gate of the first switch transistor is configured to receive acquisition control signals, and a second electrode of the first switch transistor is respectively electrically connected with a second end of the integrating capacitor and an output end of the operational amplifier, and is configured to output a first detection voltage and a second detection voltage;
a gate of the second switch transistor is configured to receive the acquisition control signals, and a second electrode of the second switch transistor is respectively electrically connected with a first end of the storage capacitor and an in-phase input end of the operational amplifier; and
a second end of the storage capacitor is connected with a grounded end.

7. A brightness compensation method applicable to the electroluminescent display panel according to claim 1, comprising:
- controlling the electroluminescent display panel to be illuminated from being extinguished, and acquiring a present current variation of each photoelectric detector; wherein each of the light-emitting structures is configured to be illuminated when a current data voltage is applied;
- determining an initial data voltage corresponding to each of the present current variations, according to a predetermined correspondence table of an initial current variation and an initial data voltage and according to the acquired present current variation corresponding to each of the photoelectric detectors; and
- determining a voltage difference between each of initial data voltages and a corresponding current data voltage, such that when the electroluminescent display panel displays images, data voltage compensation is performed according to the determined voltage difference.

8. The brightness compensation method of claim 7, wherein
- each of the light-emitting structures corresponding to the photoelectric detectors respectively corresponds to a predetermined correspondence table of the initial current variation and the initial data voltage;
  - the step of determining the initial data voltage corresponding to each of the present current variations specifically comprises:
    - determining the initial data voltage corresponding to each of the present current variations, according to the predetermined correspondence table which corresponds to each of the light-emitting structures corresponding to the photoelectric detectors and according to the acquired present current variation of each of the photoelectric detectors.

9. The brightness compensation method of claim 7, wherein
- light-emitting structures of a same color correspond to a predetermined correspondence table of the initial current variation and the initial data voltage;
  - the step of determining the initial data voltage corresponding to each of the present current variations specifically comprises:
    - for each light-emitting structure of the same color, determining the initial data voltage corresponding to each of the present current variations, according to the predetermined correspondence table which corresponds to the light-emitting structures of the same color and according to the acquired present current variation corresponding to each of the photoelectric detectors.

10. The brightness compensation method of claim 7, wherein
- the predetermined correspondence table of the initial current variation and the initial data voltage comprises: a plurality of predetermined sub-correspondence tables of an initial current variation and an initial data voltage corresponding to different ambient brightness ranges;
  - before controlling the electroluminescent display panel to be illuminated from being extinguished, and acquiring the present current variation of each photoelectric detector, the method further comprises:
    - detecting a current ambient brightness value of an environment in which the electroluminescent display panel is located;
    - for each of the light-emitting structures corresponding to the photoelectric detectors, determining a sub-correspondence table corresponding to the current ambient brightness value according to the current ambient brightness value and an ambient brightness range;
  - the step of determining the initial data voltage corresponding to each of the present current variations specifically comprises:
    - determining the initial data voltage corresponding to each of the present current variations, according to the determined sub-correspondence table corresponding to the current ambient brightness value and the acquired present current variation corresponding to each of the photoelectric detectors.

11. The brightness compensation method of claim 7, wherein,
- the step of controlling the electroluminescent display panel to be illuminated from being extinguished, and acquiring the present current variation of each photoelectric detector specifically comprises:
  - for the light-emitting structures of each color corresponding to the photoelectric detectors, controlling each light-emitting structure of the color to be extinguished, and acquiring, by the detection signal line corresponding to the light-emitting structures of the color, a first detection voltage corresponding to a photoelectric detector connected to the detection signal line;
  - controlling each light-emitting structure of the color to be illuminated, and acquiring, by the detection signal line corresponding to the light-emitting structures of the color, a second detection voltage corresponding to the photoelectric detector connected to the detection signal line; and
  - determining the present current variation corresponding to each of the photoelectric detectors, according to the first detection voltage and second detection voltage corresponding to each of the photoelectric detectors corresponding to light-emitting structures of the color.

12. A computer readable storage medium stored with computer programs thereon, wherein when the programs are executed by a processor, the method of claim 7 is implemented.

13. A computer device, comprising a memory, a processor and computer programs which are stored on the memory and capable of running on the processor, wherein when the programs are executed by the processor, the method of claim 7 is implemented.

* * * * *